United States Patent
Co et al.

(10) Patent No.: US 9,349,706 B2
(45) Date of Patent: May 24, 2016

(54) METHOD FOR PACKAGE-ON-PACKAGE ASSEMBLY WITH WIRE BONDS TO ENCAPSULATION SURFACE

(71) Applicant: Invensas Corporation, San Jose, CA (US)

(72) Inventors: Reynaldo Co, Santa Cruz, CA (US); Laura Mirkarimi, Sunol, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/380,544

(22) PCT Filed: Feb. 14, 2013

(86) PCT No.: PCT/US2013/026126
§ 371 (c)(1),
(2) Date: Aug. 22, 2014

(87) PCT Pub. No.: WO2013/126269
PCT Pub. Date: Aug. 29, 2013

(65) Prior Publication Data
US 2015/0017765 A1      Jan. 15, 2015

Related U.S. Application Data

(63) Continuation of application No. 13/752,485, filed on Jan. 29, 2013, now Pat. No. 8,772,152, which is a continuation of application No. 13/405,125, filed on Feb. 24, 2012, now Pat. No. 8,372,741.

(51) Int. Cl.
| | |
|---|---|
| H01L 21/44 | (2006.01) |
| H01L 23/00 | (2006.01) |
| B23K 20/00 | (2006.01) |
| H01L 23/31 | (2006.01) |
| H01L 23/495 | (2006.01) |
| H01L 23/498 | (2006.01) |
| H01L 21/48 | (2006.01) |
| H01L 25/10 | (2006.01) |
| H01L 23/538 | (2006.01) |
| H01L 25/00 | (2006.01) |
| H01L 25/065 | (2006.01) |

(52) U.S. Cl.
CPC .............. *H01L 24/85* (2013.01); *B23K 20/007* (2013.01); *H01L 21/4853* (2013.01);
(Continued)

(58) Field of Classification Search
CPC .............................. H01L 24/85; B23K 20/007
USPC ...................... 438/617; 219/56.22; 228/180.5
See application file for complete search history.

(56) References Cited

U.S. PATENT DOCUMENTS

| | | |
|---|---|---|
| 3,289,452 A | 12/1966 | Koellner |
| 3,358,897 A | 12/1967 | Christensen |

(Continued)

FOREIGN PATENT DOCUMENTS

| | | |
|---|---|---|
| CN | 1641832 A | 7/2005 |
| CN | 1877824 A | 12/2006 |

(Continued)

OTHER PUBLICATIONS

"EE Times Asia" [online]. [Retrieved Aug. 5, 2010]. Retrieved from internet. <http://www.eetasia.com/ART_8800428222_480300_nt_dec52276.HTM>, 4 pages.

(Continued)

*Primary Examiner* — Earl Taylor
(74) *Attorney, Agent, or Firm* — Lerner, David, Littenberg, Krumholz & Mentlik, LLP

(57) ABSTRACT

A microelectronic assembly (10) includes a substrate (12) having a first and second opposed surfaces. A microelectronic element (22) overlies the first surface and first electrically conductive elements (28) can be exposed at at least one of the first surface or second surfaces. Some of the first conductive elements (28) are electrically connected to the microelectronic element (22). Wire bonds (32) have bases (34) joined to the conductive elements (28) and end surfaces (38) remote from the substrate and the bases, each wire bond defining an edge surface (37) extending between the base and the end surface. An encapsulation layer (42) can extend from the first surface and fill spaces between the wire bonds, such that the wire bonds can be separated by the encapsulation layer. Unencapsulated portions of the wire bonds (32) are defined by at least portions of the end surfaces (38) of the wire bonds that are uncovered by the encapsulation layer (42).

4 Claims, 19 Drawing Sheets

(52) U.S. Cl.
CPC ..... *H01L 23/3121* (2013.01); *H01L 23/49517* (2013.01); *H01L 23/49811* (2013.01); *H01L 23/5389* (2013.01); *H01L 25/105* (2013.01); *H01L 25/50* (2013.01); *H01L 23/3171* (2013.01); *H01L 24/45* (2013.01); *H01L 25/0655* (2013.01); *H01L 25/0657* (2013.01); *H01L 2224/0401* (2013.01); *H01L 2224/04042* (2013.01); *H01L 2224/131* (2013.01); *H01L 2224/16145* (2013.01); *H01L 2224/16225* (2013.01); *H01L 2224/16227* (2013.01); *H01L 2224/32145* (2013.01); *H01L 2224/32225* (2013.01); *H01L 2224/32245* (2013.01); *H01L 2224/45124* (2013.01); *H01L 2224/45144* (2013.01); *H01L 2224/45147* (2013.01); *H01L 2224/45155* (2013.01); *H01L 2224/4824* (2013.01); *H01L 2224/48091* (2013.01); *H01L 2224/48145* (2013.01); *H01L 2224/48227* (2013.01); *H01L 2224/48247* (2013.01); *H01L 2224/49171* (2013.01); *H01L 2224/73204* (2013.01); *H01L 2224/73215* (2013.01); *H01L 2224/73265* (2013.01); *H01L 2224/81801* (2013.01); *H01L 2224/85* (2013.01); *H01L 2225/0651* (2013.01); *H01L 2225/06506* (2013.01); *H01L 2225/06513* (2013.01); *H01L 2225/06517* (2013.01); *H01L 2225/06558* (2013.01); *H01L 2225/06562* (2013.01); *H01L 2225/06565* (2013.01); *H01L 2225/06568* (2013.01); *H01L 2225/1023* (2013.01); *H01L 2225/1041* (2013.01); *H01L 2225/1052* (2013.01); *H01L 2225/1058* (2013.01); *H01L 2924/12042* (2013.01); *H01L 2924/15311* (2013.01); *H01L 2924/181* (2013.01); *H01L 2924/1815* (2013.01); *H01L 2924/19107* (2013.01)

(56) References Cited

U.S. PATENT DOCUMENTS

| | | |
|---|---|---|
| 3,623,649 A | 11/1971 | Keisling |
| 3,795,037 A | 3/1974 | Luttmer |
| 3,900,153 A | 8/1975 | Beerwerth et al. |
| 4,327,860 A | 5/1982 | Kirshenboin et al. |
| 4,422,568 A | 12/1983 | Elles et al. |
| 4,437,604 A | 3/1984 | Razon et al. |
| 4,604,644 A | 8/1986 | Beckham et al. |
| 4,695,870 A | 9/1987 | Patraw |
| 4,716,049 A | 12/1987 | Patraw |
| 4,771,930 A | 9/1988 | Gillotti et al. |
| 4,793,814 A | 12/1988 | Zifcak et al. |
| 4,804,132 A | 2/1989 | DiFrancesco |
| 4,845,354 A | 7/1989 | Gupta et al. |
| 4,902,600 A | 2/1990 | Tamagawa et al. |
| 4,924,353 A | 5/1990 | Patraw |
| 4,975,079 A | 12/1990 | Beaman et al. |
| 4,982,265 A | 1/1991 | Watanabe et al. |
| 4,998,885 A | 3/1991 | Beaman |
| 4,999,472 A | 3/1991 | Neinast et al. |
| 5,067,382 A | 11/1991 | Zimmerman et al. |
| 5,083,697 A | 1/1992 | Difrancesco |
| 5,095,187 A * | 3/1992 | Gliga .............. B23K 9/013 219/56.21 |
| 5,138,438 A | 8/1992 | Masayuki et al. |
| 5,148,265 A | 9/1992 | Khandros et al. |
| 5,148,266 A | 9/1992 | Khandros et al. |
| 5,186,381 A | 2/1993 | Kim |
| 5,189,505 A | 2/1993 | Bartelink |
| 5,196,726 A | 3/1993 | Nishiguchi et al. |
| 5,214,308 A | 5/1993 | Nishiguchi et al. |
| 5,220,489 A | 6/1993 | Barreto et al. |
| 5,222,014 A | 6/1993 | Lin |
| 5,340,771 A | 8/1994 | Rostoker |
| 5,371,654 A | 12/1994 | Beaman et al. |
| 5,397,997 A | 3/1995 | Tuckerman et al. |
| 5,438,224 A | 8/1995 | Papageorge et al. |
| 5,455,390 A | 10/1995 | DiStefano et al. |
| 5,468,995 A | 11/1995 | Higgins, III |
| 5,494,667 A | 2/1996 | Uchida et al. |
| 5,495,667 A | 3/1996 | Farnworth et al. |
| 5,518,964 A | 5/1996 | DiStefano et al. |
| 5,531,022 A | 7/1996 | Beaman et al. |
| 5,536,909 A | 7/1996 | DiStefano et al. |
| 5,541,567 A | 7/1996 | Fogel et al. |
| 5,571,428 A * | 11/1996 | Nishimura et al. ...... 219/121.64 |
| 5,608,265 A | 3/1997 | Kitano et al. |
| 5,615,824 A | 4/1997 | Fjelstad et al. |
| 5,635,846 A | 6/1997 | Beaman et al. |
| 5,656,550 A | 8/1997 | Tsuji et al. |
| 5,659,952 A | 8/1997 | Kovac et al. |
| 5,679,977 A | 10/1997 | Khandros et al. |
| 5,688,716 A | 11/1997 | DiStefano et al. |
| 5,718,361 A | 2/1998 | Braun et al. |
| 5,726,493 A | 3/1998 | Yamashita et al. |
| 5,731,709 A | 3/1998 | Pastore et al. |
| 5,736,780 A | 4/1998 | Murayama |
| 5,787,581 A | 8/1998 | DiStefano et al. |
| 5,801,441 A | 9/1998 | DiStefano et al. |
| 5,802,699 A | 9/1998 | Fjelstad et al. |
| 5,811,982 A | 9/1998 | Beaman et al. |
| 5,821,763 A | 10/1998 | Beaman et al. |
| 5,831,836 A | 11/1998 | Long et al. |
| 5,854,507 A | 12/1998 | Miremadi et al. |
| 5,898,991 A | 5/1999 | Fogel et al. |
| 5,912,505 A | 6/1999 | Itoh et al. |
| 5,953,624 A | 9/1999 | Bando et al. |
| 5,971,253 A | 10/1999 | Gilleo et al. |
| 5,973,391 A | 10/1999 | Bischoff et al. |
| 5,977,618 A | 11/1999 | DiStefano et al. |
| 5,980,270 A | 11/1999 | Fjelstad et al. |
| 5,989,936 A | 11/1999 | Smith et al. |
| 5,994,152 A | 11/1999 | Khandros et al. |
| 6,002,168 A | 12/1999 | Bellaar et al. |
| 6,032,359 A | 3/2000 | Carroll |
| 6,038,136 A | 3/2000 | Weber |
| 6,052,287 A | 4/2000 | Palmer et al. |
| 6,054,337 A | 4/2000 | Solberg |
| 6,054,756 A | 4/2000 | DiStefano et al. |
| 6,077,380 A | 6/2000 | Hayes et al. |
| 6,117,694 A | 9/2000 | Smith et al. |
| 6,121,676 A | 9/2000 | Solberg |
| 6,124,546 A | 9/2000 | Hayward et al. |
| 6,133,072 A | 10/2000 | Fjelstad |
| 6,157,080 A | 12/2000 | Tamaki et al. |
| 6,158,647 A | 12/2000 | Chapman et al. |
| 6,164,523 A | 12/2000 | Fauty et al. |
| 6,168,965 B1 | 1/2001 | Malinovich et al. |
| 6,177,636 B1 | 1/2001 | Fjelstad |
| 6,194,250 B1 | 2/2001 | Melton et al. |
| 6,194,291 B1 | 2/2001 | DiStefano et al. |
| 6,202,297 B1 | 3/2001 | Faraci et al. |
| 6,206,273 B1 | 3/2001 | Beaman et al. |
| 6,208,024 B1 | 3/2001 | DiStefano |
| 6,211,572 B1 | 4/2001 | Fjelstad et al. |
| 6,215,670 B1 | 4/2001 | Khandros |
| 6,218,728 B1 | 4/2001 | Kimura |
| 6,225,688 B1 | 5/2001 | Kim et al. |
| 6,258,625 B1 | 7/2001 | Brofman et al. |
| 6,260,264 B1 | 7/2001 | Chen et al. |
| 6,262,482 B1 | 7/2001 | Shiraishi et al. |
| 6,295,729 B1 | 10/2001 | Beaman et al. |
| 6,300,780 B1 | 10/2001 | Beaman et al. |
| 6,303,997 B1 | 10/2001 | Lee et al. |
| 6,313,528 B1 | 11/2001 | Solberg |
| 6,316,838 B1 | 11/2001 | Ozawa et al. |
| 6,332,270 B2 | 12/2001 | Beaman et al. |
| 6,334,247 B1 | 1/2002 | Beaman et al. |
| 6,358,627 B2 | 3/2002 | Benenati et al. |
| 6,362,520 B2 | 3/2002 | DiStefano |
| 6,362,525 B1 | 3/2002 | Rahim |

(56) References Cited

U.S. PATENT DOCUMENTS

| | | |
|---|---|---|
| 6,376,769 B1 | 4/2002 | Chung |
| 6,388,333 B1 | 5/2002 | Taniguchi et al. |
| 6,407,448 B2 | 6/2002 | Chun |
| 6,439,450 B1 | 8/2002 | Chapman et al. |
| 6,458,411 B1 | 10/2002 | Goossen et al. |
| 6,476,503 B1 | 11/2002 | Imamura et al. |
| 6,476,583 B2 | 11/2002 | McAndrews |
| 6,495,914 B1 | 12/2002 | Sekine et al. |
| 6,507,104 B2 | 1/2003 | Ho et al. |
| 6,509,639 B1 | 1/2003 | Lin |
| 6,514,847 B1 | 2/2003 | Ohsawa et al. |
| 6,515,355 B1 | 2/2003 | Jiang et al. |
| 6,522,018 B1 | 2/2003 | Tay et al. |
| 6,526,655 B2 | 3/2003 | Beaman et al. |
| 6,531,784 B1 | 3/2003 | Shim et al. |
| 6,545,228 B2 | 4/2003 | Hashimoto |
| 6,550,666 B2 | 4/2003 | Chew et al. |
| 6,555,918 B2 | 4/2003 | Masuda et al. |
| 6,560,117 B2 | 5/2003 | Moon |
| 6,573,458 B1 | 6/2003 | Matsubara et al. |
| 6,578,754 B1 | 6/2003 | Tung |
| 6,581,283 B2 | 6/2003 | Sugiura et al. |
| 6,624,653 B1 | 9/2003 | Cram |
| 6,630,730 B2 | 10/2003 | Grigg |
| 6,647,310 B1 | 11/2003 | Yi et al. |
| 6,684,007 B2 | 1/2004 | Yoshimura et al. |
| 6,687,988 B1 | 2/2004 | Sugiura et al. |
| 6,699,730 B2 | 3/2004 | Kim et al. |
| 6,708,403 B2 | 3/2004 | Beaman et al. |
| 6,730,544 B1 | 5/2004 | Yang |
| 6,734,542 B2 | 5/2004 | Nakatani et al. |
| 6,746,894 B2 | 6/2004 | Fee et al. |
| 6,762,078 B2 | 7/2004 | Shin et al. |
| 6,765,287 B1 | 7/2004 | Lin |
| 6,774,467 B2 | 8/2004 | Horiuchi et al. |
| 6,774,473 B1 | 8/2004 | Shen |
| 6,774,494 B2 | 8/2004 | Arakawa |
| 6,777,787 B2 | 8/2004 | Shibata |
| 6,790,757 B1 | 9/2004 | Chittipeddi et al. |
| 6,815,257 B2 | 11/2004 | Yoon et al. |
| 6,828,668 B2 | 12/2004 | Smith et al. |
| 6,844,619 B2 | 1/2005 | Tago |
| 6,856,235 B2 | 2/2005 | Fjelstad |
| 6,867,499 B1 | 3/2005 | Tabrizi |
| 6,900,530 B1 | 5/2005 | Tsai |
| 6,902,869 B2 | 6/2005 | Appelt et al. |
| 6,902,950 B2 | 6/2005 | Ma et al. |
| 6,930,256 B1 | 8/2005 | Huemoeller et al. |
| 6,933,608 B2 | 8/2005 | Fujisawa |
| 6,946,380 B2 | 9/2005 | Takahashi |
| 6,962,282 B2 | 11/2005 | Manansala |
| 6,962,864 B1 | 11/2005 | Jeng et al. |
| 6,979,599 B2 | 12/2005 | Silverbrook |
| 6,987,032 B1 | 1/2006 | Fan et al. |
| 7,009,297 B1 | 3/2006 | Chiang et al. |
| 7,045,884 B2 | 5/2006 | Standing |
| 7,061,079 B2 | 6/2006 | Weng et al. |
| 7,061,097 B2 | 6/2006 | Yokoi |
| 7,067,911 B1 | 6/2006 | Lin et al. |
| 7,071,573 B1 * | 7/2006 | Lin .................... H01L 21/4832 257/778 |
| 7,119,427 B2 | 10/2006 | Kim |
| 7,121,891 B2 | 10/2006 | Cherian |
| 7,170,185 B1 | 1/2007 | Hogerton et al. |
| 7,176,506 B2 | 2/2007 | Beroz et al. |
| 7,176,559 B2 | 2/2007 | Ho et al. |
| 7,185,426 B1 | 3/2007 | Hiner et al. |
| 7,190,061 B2 | 3/2007 | Lee |
| 7,215,033 B2 | 5/2007 | Lee et al. |
| 7,225,538 B2 | 6/2007 | Eldridge et al. |
| 7,227,095 B2 | 6/2007 | Roberts et al. |
| 7,229,906 B2 | 6/2007 | Babinetz et al. |
| 7,233,057 B2 | 6/2007 | Hussa |
| 7,242,081 B1 | 7/2007 | Lee |
| 7,262,124 B2 | 8/2007 | Fujisawa |
| 7,268,421 B1 * | 9/2007 | Lin ....................... H01L 21/568 257/106 |
| 7,294,928 B2 | 11/2007 | Bang et al. |
| 7,323,767 B2 | 1/2008 | James et al. |
| 7,365,416 B2 | 4/2008 | Kawabata et al. |
| 7,371,676 B2 | 5/2008 | Hembree |
| 7,372,151 B1 | 5/2008 | Fan et al. |
| 7,391,105 B2 | 6/2008 | Yeom |
| 7,391,121 B2 | 6/2008 | Otremba |
| 7,416,107 B2 | 8/2008 | Chapman et al. |
| 7,456,091 B2 | 11/2008 | Kuraya et al. |
| 7,476,608 B2 | 1/2009 | Craig et al. |
| 7,476,962 B2 | 1/2009 | Kim |
| 7,485,562 B2 | 2/2009 | Chua et al. |
| 7,495,342 B2 | 2/2009 | Beaman et al. |
| 7,517,733 B2 | 4/2009 | Camacho et al. |
| 7,538,565 B1 | 5/2009 | Beaman et al. |
| 7,550,836 B2 | 6/2009 | Chou et al. |
| 7,576,439 B2 | 8/2009 | Craig et al. |
| 7,578,422 B2 | 8/2009 | Lange et al. |
| 7,589,394 B2 | 9/2009 | Kawano |
| 7,621,436 B2 | 11/2009 | Mii et al. |
| 7,625,781 B2 | 12/2009 | Beer |
| 7,633,765 B1 | 12/2009 | Scanlan et al. |
| 7,642,133 B2 | 1/2010 | Wu et al. |
| 7,646,102 B2 | 1/2010 | Boon |
| 7,671,457 B1 | 3/2010 | Hiner et al. |
| 7,671,459 B2 | 3/2010 | Corisis et al. |
| 7,675,152 B2 | 3/2010 | Gerber et al. |
| 7,677,429 B2 | 3/2010 | Chapman et al. |
| 7,682,962 B2 | 3/2010 | Hembree |
| 7,728,443 B2 | 6/2010 | Hembree |
| 7,737,545 B2 | 6/2010 | Fjelstad et al. |
| 7,750,483 B1 * | 7/2010 | Lin ....................... H01L 21/568 257/776 |
| 7,757,385 B2 | 7/2010 | Hembree |
| 7,777,351 B1 | 8/2010 | Berry et al. |
| 7,780,064 B2 | 8/2010 | Wong et al. |
| 7,781,877 B2 | 8/2010 | Jiang et al. |
| 7,795,717 B2 | 9/2010 | Goller |
| 7,808,093 B2 | 10/2010 | Kagaya et al. |
| 7,842,541 B1 | 11/2010 | Rusli et al. |
| 7,850,087 B2 | 12/2010 | Hwang et al. |
| 7,855,462 B2 | 12/2010 | Boon et al. |
| 7,880,290 B2 | 2/2011 | Park |
| 7,892,889 B2 | 2/2011 | Howard et al. |
| 7,902,644 B2 | 3/2011 | Huang et al. |
| 7,919,846 B2 | 4/2011 | Hembree |
| 7,932,170 B1 | 4/2011 | Huemoeller et al. |
| 7,934,313 B1 | 5/2011 | Lin et al. |
| 7,964,956 B1 | 6/2011 | Bet-Shliemoun |
| 7,967,062 B2 | 6/2011 | Campbell et al. |
| 7,977,597 B2 | 7/2011 | Roberts et al. |
| 8,012,797 B2 | 9/2011 | Shen et al. |
| 8,020,290 B2 | 9/2011 | Sheats |
| 8,039,970 B2 | 10/2011 | Yamamori et al. |
| 8,071,431 B2 | 12/2011 | Hoang et al. |
| 8,071,470 B2 | 12/2011 | Khor et al. |
| 8,084,867 B2 | 12/2011 | Tang et al. |
| 8,092,734 B2 | 1/2012 | Jiang et al. |
| 8,093,697 B2 | 1/2012 | Haba et al. |
| 8,213,184 B2 | 7/2012 | Knickerbocker |
| 8,217,502 B2 | 7/2012 | Ko |
| 8,232,141 B2 | 7/2012 | Choi et al. |
| 8,264,091 B2 | 9/2012 | Cho et al. |
| 8,278,746 B2 | 10/2012 | Ding et al. |
| 8,304,900 B2 | 11/2012 | Jang et al. |
| 8,314,492 B2 | 11/2012 | Egawa |
| 8,319,338 B1 | 11/2012 | Berry et al. |
| 8,482,111 B2 | 7/2013 | Haba |
| 8,525,314 B2 | 9/2013 | Haba et al. |
| 8,525,318 B1 | 9/2013 | Kim et al. |
| 8,618,659 B2 * | 12/2013 | Sato ................... H01L 23/3121 257/737 |
| 8,659,164 B2 | 2/2014 | Haba |
| 8,680,684 B2 | 3/2014 | Haba et al. |
| 8,728,865 B2 | 5/2014 | Haba et al. |
| 8,836,136 B2 * | 9/2014 | Chau ................ H01L 23/49517 257/735 |

(56) References Cited

U.S. PATENT DOCUMENTS

| | | | |
|---|---|---|---|
| 8,878,353 B2 * | 11/2014 | Haba | H05K 1/185 257/686 |
| 8,927,337 B2 | 1/2015 | Haba et al. | |
| 8,987,132 B2 | 3/2015 | Gruber et al. | |
| 2001/0002607 A1 * | 6/2001 | Sugiura et al. | 156/91 |
| 2001/0007370 A1 | 7/2001 | Distefano | |
| 2001/0021541 A1 | 9/2001 | Akram et al. | |
| 2001/0028114 A1 | 10/2001 | Hosomi | |
| 2001/0045012 A1 * | 11/2001 | Beaman et al. | 29/868 |
| 2001/0048151 A1 | 12/2001 | Chun | |
| 2002/0014004 A1 | 2/2002 | Beaman et al. | |
| 2002/0066952 A1 | 6/2002 | Taniguchi et al. | |
| 2002/0117330 A1 | 8/2002 | Eldridge et al. | |
| 2002/0125571 A1 | 9/2002 | Corisis et al. | |
| 2002/0153602 A1 | 10/2002 | Tay et al. | |
| 2002/0164838 A1 | 11/2002 | Moon et al. | |
| 2002/0171152 A1 | 11/2002 | Miyazaki | |
| 2002/0185735 A1 | 12/2002 | Sakurai et al. | |
| 2003/0002770 A1 | 1/2003 | Chakravorty et al. | |
| 2003/0006494 A1 | 1/2003 | Lee et al. | |
| 2003/0048108 A1 | 3/2003 | Beaman et al. | |
| 2003/0057544 A1 | 3/2003 | Nathan et al. | |
| 2003/0094666 A1 | 5/2003 | Clayton et al. | |
| 2003/0094700 A1 | 5/2003 | Aiba et al. | |
| 2003/0106213 A1 | 6/2003 | Beaman et al. | |
| 2003/0124767 A1 | 7/2003 | Lee et al. | |
| 2003/0162378 A1 | 8/2003 | Mikami | |
| 2003/0164540 A1 | 9/2003 | Lee et al. | |
| 2004/0014309 A1 | 1/2004 | Nakanishi | |
| 2004/0036164 A1 | 2/2004 | Koike et al. | |
| 2004/0038447 A1 | 2/2004 | Corisis et al. | |
| 2004/0075164 A1 | 4/2004 | Pu et al. | |
| 2004/0090756 A1 | 5/2004 | Ho et al. | |
| 2004/0110319 A1 | 6/2004 | Fukutomi et al. | |
| 2004/0119152 A1 | 6/2004 | Karnezos et al. | |
| 2004/0124518 A1 | 7/2004 | Karnezos | |
| 2004/0148773 A1 | 8/2004 | Beaman et al. | |
| 2004/0152292 A1 | 8/2004 | Babinetz et al. | |
| 2004/0160751 A1 | 8/2004 | Inagaki et al. | |
| 2004/0188499 A1 | 9/2004 | Nosaka | |
| 2004/0262728 A1 | 12/2004 | Sterrett et al. | |
| 2004/0262734 A1 | 12/2004 | Yoo | |
| 2005/0017369 A1 | 1/2005 | Clayton et al. | |
| 2005/0035440 A1 | 2/2005 | Mohammed | |
| 2005/0062492 A1 | 3/2005 | Beaman et al. | |
| 2005/0082664 A1 | 4/2005 | Funaba et al. | |
| 2005/0095835 A1 | 5/2005 | Humpston et al. | |
| 2005/0116326 A1 | 6/2005 | Haba et al. | |
| 2005/0121764 A1 | 6/2005 | Mallik et al. | |
| 2005/0133916 A1 | 6/2005 | Karnezos | |
| 2005/0133932 A1 | 6/2005 | Pohl et al. | |
| 2005/0140265 A1 | 6/2005 | Hirakata | |
| 2005/0151235 A1 | 7/2005 | Yokoi | |
| 2005/0151238 A1 | 7/2005 | Yamunan | |
| 2005/0173805 A1 | 8/2005 | Damberg et al. | |
| 2005/0173807 A1 | 8/2005 | Zhu et al. | |
| 2005/0181544 A1 | 8/2005 | Haba et al. | |
| 2005/0181655 A1 | 8/2005 | Haba et al. | |
| 2005/0212109 A1 | 9/2005 | Cherukuri et al. | |
| 2005/0253213 A1 | 11/2005 | Jiang et al. | |
| 2005/0266672 A1 | 12/2005 | Jeng et al. | |
| 2005/0285246 A1 | 12/2005 | Haba et al. | |
| 2006/0118641 A1 | 6/2006 | Hwang et al. | |
| 2006/0166397 A1 | 7/2006 | Lau et al. | |
| 2006/0197220 A1 | 9/2006 | Beer | |
| 2006/0255449 A1 | 11/2006 | Lee et al. | |
| 2006/0278682 A1 | 12/2006 | Lange et al. | |
| 2006/0278970 A1 | 12/2006 | Yano et al. | |
| 2007/0015353 A1 | 1/2007 | Craig et al. | |
| 2007/0090524 A1 | 4/2007 | Abbott | |
| 2007/0148822 A1 | 6/2007 | Haba et al. | |
| 2007/0181989 A1 | 8/2007 | Corisis et al. | |
| 2007/0190747 A1 | 8/2007 | Humpston et al. | |
| 2007/0235850 A1 | 10/2007 | Gerber et al. | |
| 2007/0235856 A1 | 10/2007 | Haba et al. | |
| 2007/0241437 A1 | 10/2007 | Kagaya et al. | |
| 2007/0254406 A1 | 11/2007 | Lee | |
| 2007/0271781 A9 | 11/2007 | Beaman et al. | |
| 2007/0290325 A1 | 12/2007 | Wu et al. | |
| 2008/0006942 A1 | 1/2008 | Park et al. | |
| 2008/0017968 A1 | 1/2008 | Choi et al. | |
| 2008/0029849 A1 | 2/2008 | Hedler et al. | |
| 2008/0032519 A1 | 2/2008 | Murata | |
| 2008/0047741 A1 | 2/2008 | Beaman et al. | |
| 2008/0048309 A1 | 2/2008 | Corisis et al. | |
| 2008/0048690 A1 | 2/2008 | Beaman et al. | |
| 2008/0048691 A1 | 2/2008 | Beaman et al. | |
| 2008/0048697 A1 | 2/2008 | Beaman et al. | |
| 2008/0054434 A1 | 3/2008 | Kim | |
| 2008/0073769 A1 | 3/2008 | Wu et al. | |
| 2008/0073771 A1 | 3/2008 | Seo et al. | |
| 2008/0076208 A1 | 3/2008 | Wu et al. | |
| 2008/0100316 A1 | 5/2008 | Beaman et al. | |
| 2008/0100317 A1 | 5/2008 | Beaman et al. | |
| 2008/0100318 A1 | 5/2008 | Beaman et al. | |
| 2008/0100324 A1 | 5/2008 | Beaman et al. | |
| 2008/0105984 A1 | 5/2008 | Lee | |
| 2008/0106281 A1 | 5/2008 | Beaman et al. | |
| 2008/0106282 A1 | 5/2008 | Beaman et al. | |
| 2008/0106283 A1 | 5/2008 | Beaman et al. | |
| 2008/0106284 A1 | 5/2008 | Beaman et al. | |
| 2008/0106285 A1 | 5/2008 | Beaman et al. | |
| 2008/0106291 A1 | 5/2008 | Beaman et al. | |
| 2008/0106872 A1 | 5/2008 | Beaman et al. | |
| 2008/0111568 A1 | 5/2008 | Beaman et al. | |
| 2008/0111569 A1 | 5/2008 | Beaman et al. | |
| 2008/0111570 A1 | 5/2008 | Beaman et al. | |
| 2008/0112144 A1 | 5/2008 | Beaman et al. | |
| 2008/0112145 A1 | 5/2008 | Beaman et al. | |
| 2008/0112146 A1 | 5/2008 | Beaman et al. | |
| 2008/0112147 A1 | 5/2008 | Beaman et al. | |
| 2008/0112148 A1 | 5/2008 | Beaman et al. | |
| 2008/0112149 A1 | 5/2008 | Beaman et al. | |
| 2008/0116912 A1 | 5/2008 | Beaman et al. | |
| 2008/0116913 A1 | 5/2008 | Beaman et al. | |
| 2008/0116914 A1 | 5/2008 | Beaman et al. | |
| 2008/0116915 A1 | 5/2008 | Beaman et al. | |
| 2008/0116916 A1 | 5/2008 | Beaman et al. | |
| 2008/0117611 A1 | 5/2008 | Beaman et al. | |
| 2008/0117612 A1 | 5/2008 | Beaman et al. | |
| 2008/0117613 A1 | 5/2008 | Beaman et al. | |
| 2008/0121879 A1 | 5/2008 | Beaman et al. | |
| 2008/0123310 A1 | 5/2008 | Beaman et al. | |
| 2008/0129319 A1 | 6/2008 | Beaman et al. | |
| 2008/0129320 A1 | 6/2008 | Beaman et al. | |
| 2008/0132094 A1 | 6/2008 | Beaman et al. | |
| 2008/0156518 A1 | 7/2008 | Honer et al. | |
| 2008/0164595 A1 | 7/2008 | Wu et al. | |
| 2008/0211084 A1 | 9/2008 | Chow et al. | |
| 2008/0277772 A1 | 11/2008 | Groenhuis et al. | |
| 2008/0284001 A1 | 11/2008 | Mori et al. | |
| 2008/0284045 A1 | 11/2008 | Gerber et al. | |
| 2008/0303132 A1 | 12/2008 | Mohammed et al. | |
| 2008/0303153 A1 | 12/2008 | Oi et al. | |
| 2008/0315385 A1 | 12/2008 | Gerber et al. | |
| 2009/0014876 A1 | 1/2009 | Youn et al. | |
| 2009/0026609 A1 | 1/2009 | Masuda | |
| 2009/0032913 A1 | 2/2009 | Haba | |
| 2009/0045497 A1 | 2/2009 | Kagaya et al. | |
| 2009/0050994 A1 | 2/2009 | Ishihara et al. | |
| 2009/0085185 A1 | 4/2009 | Byun et al. | |
| 2009/0085205 A1 | 4/2009 | Sugizaki | |
| 2009/0091009 A1 | 4/2009 | Corisis et al. | |
| 2009/0102063 A1 | 4/2009 | Lee et al. | |
| 2009/0104736 A1 | 4/2009 | Haba et al. | |
| 2009/0127686 A1 | 5/2009 | Yang et al. | |
| 2009/0128176 A1 | 5/2009 | Beaman et al. | |
| 2009/0146301 A1 | 6/2009 | Shimizu et al. | |
| 2009/0160065 A1 | 6/2009 | Haba et al. | |
| 2009/0189288 A1 | 7/2009 | Beaman et al. | |
| 2009/0206461 A1 | 8/2009 | Yoon | |
| 2009/0212442 A1 | 8/2009 | Chow et al. | |
| 2009/0236700 A1 | 9/2009 | Moriya | |
| 2009/0236753 A1 | 9/2009 | Moon et al. | |

(56) References Cited

U.S. PATENT DOCUMENTS

| | | |
|---|---|---|
| 2009/0256229 A1 | 10/2009 | Ishikawa et al. |
| 2009/0261466 A1 | 10/2009 | Pagaila et al. |
| 2009/0302445 A1 | 12/2009 | Pagaila et al. |
| 2009/0315579 A1 | 12/2009 | Beaman et al. |
| 2010/0003822 A1 | 1/2010 | Miyata et al. |
| 2010/0006963 A1 | 1/2010 | Brady |
| 2010/0007009 A1 | 1/2010 | Chang et al. |
| 2010/0025835 A1 | 2/2010 | Oh et al. |
| 2010/0052135 A1 | 3/2010 | Shim et al. |
| 2010/0078789 A1 | 4/2010 | Choi et al. |
| 2010/0078795 A1 | 4/2010 | Dekker et al. |
| 2010/0087035 A1 | 4/2010 | Yoo et al. |
| 2010/0090330 A1 | 4/2010 | Nakazato |
| 2010/0109138 A1 | 5/2010 | Cho |
| 2010/0117212 A1 | 5/2010 | Corisis et al. |
| 2010/0133675 A1 | 6/2010 | Yu et al. |
| 2010/0193937 A1 | 8/2010 | Nagamatsu et al. |
| 2010/0213560 A1 | 8/2010 | Wang et al. |
| 2010/0224975 A1 | 9/2010 | Shin et al. |
| 2010/0232129 A1 | 9/2010 | Haba et al. |
| 2010/0237471 A1 | 9/2010 | Pagaila et al. |
| 2010/0289142 A1 | 11/2010 | Shim et al. |
| 2010/0314748 A1 | 12/2010 | Hsu et al. |
| 2010/0327419 A1 | 12/2010 | Muthukumar et al. |
| 2011/0057308 A1 | 3/2011 | Choi et al. |
| 2011/0068453 A1 | 3/2011 | Cho et al. |
| 2011/0115081 A1 | 5/2011 | Osumi |
| 2011/0140259 A1 | 6/2011 | Cho et al. |
| 2011/0147911 A1 | 6/2011 | Kohl et al. |
| 2011/0223721 A1 | 9/2011 | Cho et al. |
| 2011/0237027 A1 | 9/2011 | Kim et al. |
| 2011/0241192 A1 | 10/2011 | Ding et al. |
| 2011/0241193 A1 | 10/2011 | Ding et al. |
| 2011/0272449 A1 | 11/2011 | Pirkle et al. |
| 2012/0015481 A1 | 1/2012 | Kim |
| 2012/0018885 A1 | 1/2012 | Lee et al. |
| 2012/0043655 A1 | 2/2012 | Khor et al. |
| 2012/0061814 A1 | 3/2012 | Camacho et al. |
| 2012/0063090 A1 | 3/2012 | Hsiao et al. |
| 2012/0080787 A1 | 4/2012 | Shah et al. |
| 2012/0086130 A1 | 4/2012 | Sasaki et al. |
| 2012/0119380 A1 | 5/2012 | Haba |
| 2012/0145442 A1 | 6/2012 | Gupta et al. |
| 2012/0146235 A1 | 6/2012 | Choi et al. |
| 2012/0184116 A1 | 7/2012 | Pawlikowski et al. |
| 2012/0280374 A1 | 11/2012 | Choi et al. |
| 2012/0280386 A1 | 11/2012 | Sato et al. |
| 2013/0049221 A1 | 2/2013 | Han et al. |
| 2013/0069222 A1 | 3/2013 | Camacho |
| 2013/0241083 A1 | 9/2013 | Yu et al. |
| 2014/0036454 A1 | 2/2014 | Caskey et al. |
| 2014/0124949 A1 | 5/2014 | Paek et al. |
| 2015/0017765 A1* | 1/2015 | Co .................... H01L 23/5389 438/126 |

FOREIGN PATENT DOCUMENTS

| | | |
|---|---|---|
| CN | 101449375 A | 6/2009 |
| CN | 101675516 A | 3/2010 |
| CN | 101819959 A | 9/2010 |
| CN | 102324418 A | 1/2012 |
| EP | 920058 | 6/1999 |
| EP | 1449414 A1 | 8/2004 |
| EP | 2234158 A1 | 9/2010 |
| JP | 61125062 A | 6/1986 |
| JP | 62-226307 | 10/1987 |
| JP | 1012769 A | 1/1989 |
| JP | 64-71162 | 3/1989 |
| JP | H04-346436 A | 12/1992 |
| JP | 06268015 A | 9/1994 |
| JP | 07-122787 A | 5/1995 |
| JP | 09505439 | 5/1997 |
| JP | H1065054 A | 3/1998 |
| JP | H10-135221 A | 5/1998 |
| JP | H10135220 A | 5/1998 |
| JP | 11-074295 A | 3/1999 |
| JP | 11135663 A | 5/1999 |
| JP | 11251350 A | 9/1999 |
| JP | H11-260856 A | 9/1999 |
| JP | 2001196407 A | 7/2001 |
| JP | 2001326236 A | 11/2001 |
| JP | 2002289769 A | 10/2002 |
| JP | 2003122611 A | 4/2003 |
| JP | 2003-174124 A | 6/2003 |
| JP | 2003307897 A | 10/2003 |
| JP | 2004281514 A | 10/2004 |
| JP | 2004327856 A | 11/2004 |
| JP | 2004343030 A | 12/2004 |
| JP | 2005011874 A | 1/2005 |
| JP | 2003377641 A | 6/2005 |
| JP | 2005142378 A | 6/2005 |
| JP | 2005175019 A | 6/2005 |
| JP | 2003426392 A | 7/2005 |
| JP | 2005183880 A | 7/2005 |
| JP | 2005183923 A | 7/2005 |
| JP | 2005203497 A | 7/2005 |
| JP | 2005302765 A | 10/2005 |
| JP | 2006344917 | 12/2006 |
| JP | 2007123595 A | 5/2007 |
| JP | 2007234845 A | 9/2007 |
| JP | 2007287922 A | 11/2007 |
| JP | 2007-335464 | 12/2007 |
| JP | 2008166439 A | 7/2008 |
| JP | 2008171938 A | 7/2008 |
| JP | 2008251794 A | 10/2008 |
| JP | 2009004650 A | 1/2009 |
| JP | 2009506553 | 2/2009 |
| JP | 2009260132 A | 11/2009 |
| JP | 2010103129 A | 5/2010 |
| JP | 2010192928 A | 9/2010 |
| JP | 2010206007 A | 9/2010 |
| KR | 100265563 | 9/2000 |
| KR | 2001-0094894 A | 11/2001 |
| KR | 10-0393102 | 7/2002 |
| KR | 20020058216 A | 7/2002 |
| KR | 20060064291 A | 6/2006 |
| KR | 20080020069 A | 3/2008 |
| KR | 100865125 B1 | 10/2008 |
| KR | 20080094251 A | 10/2008 |
| KR | 100886100 B1 | 2/2009 |
| KR | 20090033605 A | 4/2009 |
| KR | 20090123680 A | 12/2009 |
| KR | 20100033012 A | 3/2010 |
| KR | 20100062315 A | 6/2010 |
| KR | 101011863 B1 | 1/2011 |
| KR | 20150012285 A | 2/2015 |
| TW | 200810079 A | 2/2008 |
| TW | 200933760 A | 8/2009 |
| TW | 201023277 A | 6/2010 |
| WO | 02/13256 A1 | 2/2002 |
| WO | 03045123 A1 | 5/2003 |
| WO | 2006050691 A2 | 5/2006 |
| WO | 2008065896 A1 | 6/2008 |
| WO | 2008120755 A1 | 10/2008 |
| WO | 2010041630 A1 | 4/2010 |
| WO | 2010101163 A1 | 9/2010 |
| WO | 2014107301 A1 | 7/2014 |

OTHER PUBLICATIONS

"Wafer Level Stack—WDoD", [online]. [Retrieved Aug. 5, 2010]. Retrieved from the internet. <http://www.3d-plus.com/techno-wafer-level-stack-wdod.php>, 2 pages.

Bang, U.S. Appl. No. 10/656,534, filed Sep. 5, 2003.

Extended European Search Report for Application No. EP13162975 dated Sep. 5, 2013.

International Search Report and Written Opinion for Application No. PCT/US2011/044346 dated May 11, 2012.

International Search Report and Written Opinion for Application No. PCT/US2012/060402 dated Apr. 2, 2013.

International Search Report and Written Opinion for Application No. PCT/US2013/026126 dated Jul. 25, 2013.

(56) References Cited

OTHER PUBLICATIONS

International Search Report and Written Opinion for Application No. PCT/US2013/041981 dated Nov. 13, 2013.
International Search Report and Written Opinion for Application No. PCT/US2013/052883 dated Oct. 21, 2013.
International Search Report and Written Opinion for Application No. PCT/US2013/053437 dated Nov. 25, 2013.
International Search Report and Written Opinion for Application No. PCT/US2013/075672 dated Apr. 22, 2014.
International Search Report and Written Opinion for PCT/US2011/060551 dated Apr. 18, 2012.
International Search Report and Written Opinion PCT/US2011/044342 dated May 7, 2012.
International Search Report Application No. PCT/US2011/024143, dated Sep. 14, 2011.
International Search Report, PCT/US2005/039716, Apr. 5, 2006.
Japanese Office Action for Application No. 2013-509325 dated Oct. 18, 2013.
Jin, Yonggang et al., "STM 3D-IC Package and 3D eWLB Development," STMicroelectronics Singapore/STMicroelectronics France May 21, 2010.
Kim et al., "Application of Through Mold Via (TMV) as PoP base package", 6 pages (2008).
Korean Office Action for Application No. 10-2011-0041843 dated Jun. 20, 2011.
Korean Search Report KR10-2011-0041843 dated Feb. 24, 2011.
Meiser S, "Klein und Komplex", Elektronik, IRL Press Limited, DE, vol. 41, No. 1, Jan. 7, 1992, pp. 72-77, XP000277326. (International Search Report for Application No. PCT/US2012/060402 dated Feb. 21, 2013 provides concise statement of relevance.).
Neo-Manhattan Technology, A Novel HDI Manufacturing Process, "High-Density Interconnects for Advanced Flex Substrates & 3-D Package Stacking," IPC Flex & Chips Symposium, Tempe, AZ, Feb. 11-12, 2003.
North Corporation, "Processed Intra-layer Interconnection Material for PWBs [Etched Copper Bump with Copper Foil]," NMBITM, Version 2001.6.
Office Action for Taiwan Application No. 100125521 dated Dec. 20, 2013.
Office Action from Taiwan for Application No. 100125522 dated Jan. 27, 2014.
Office Action from U.S. Appl. No. 12/769,930 mailed May 5, 2011.
Partial International Search Report for Application No. PCT/US2012/060402 dated Feb. 21, 2013.
Partial International Search Report for Application No. PCT/US2013/026126 dated Jun. 17, 2013.
Partial International Search Report for Application No. PCT/US2013/075672 dated Mar. 12, 2014.
Partial International Search Report from Invitation to Pay Additional Fees for Application No. PCT/US2012/028738 dated Jun. 6, 2012.
Redistributed Chip Package (RCP) Technology, Freescale Semiconductor, 2005, 6 pages.
Search Report from Korean Patent Applicatin No. 10-2010-0113271 dated Jan. 12, 2011.
Taiwanese Office Action for Application No. 100141695 dated Mar. 19, 2014.
Taiwanese Office Action for Application No. 101138311 dated Jun. 27, 2014.
Yoon, PhD, Seung Wook, "Next Generation Wafer Level Packaging Solution for 3D integration," May 2010, STATS ChipPAC Ltd.
Chinese Office Action for Application No. 201180022247.8 dated Sep. 16, 2014.
International Search Report and Written Opinion for Application No. PCT/US2011/024143 dated Jan. 17, 2012.
Korean Office Action for Application No. 2014-7025992 dated Feb. 5, 2015.
Taiwanese Office Action for Application No. 100140428 dated Jan. 26, 2015.
Japanese Office Action for Application No. 2013-520776 dated Apr. 21, 2015.
International Search Report and Written Opinion for Application No. PCT/US2015/011715 dated Apr. 20, 2015.
Chinese Office Action for Application No. 201180022247.8 dated Apr. 14, 2015.
Japanese Office Action for Application No. 2013-520777 dated May 22, 2015.
Chinese Office Action for Application No. 201310264264.3 dated May 12, 2015.
Partial International Search Report for Application No. PCT/US2015/033004 dated Sep. 9, 2015.

* cited by examiner

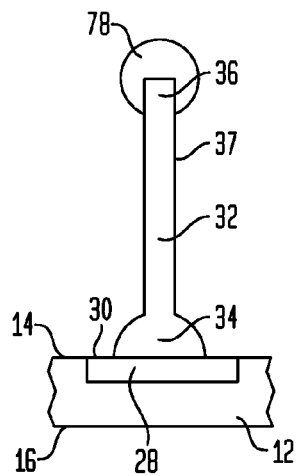
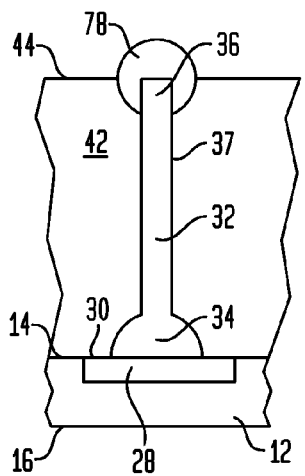
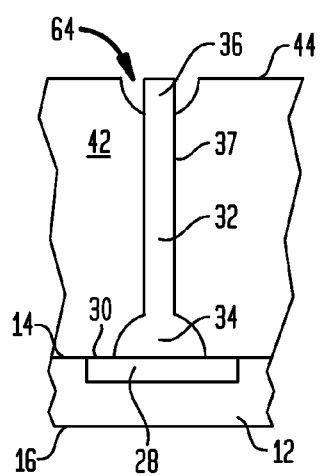
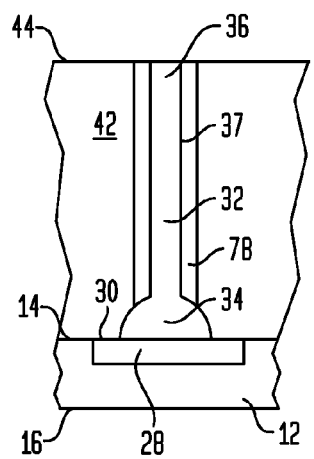
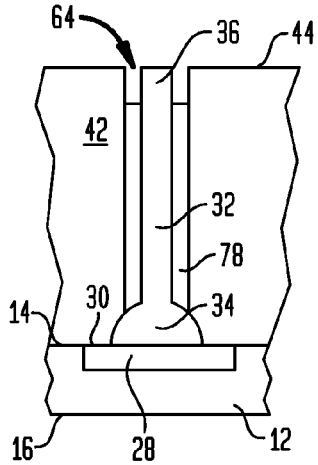
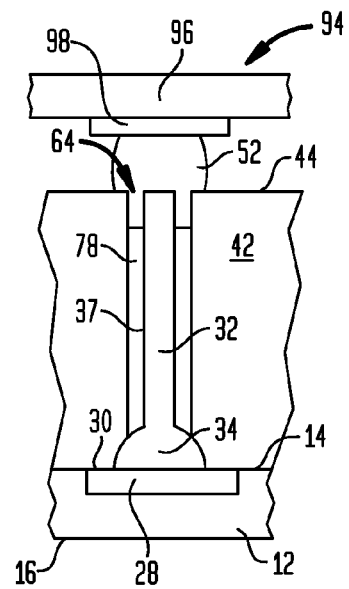

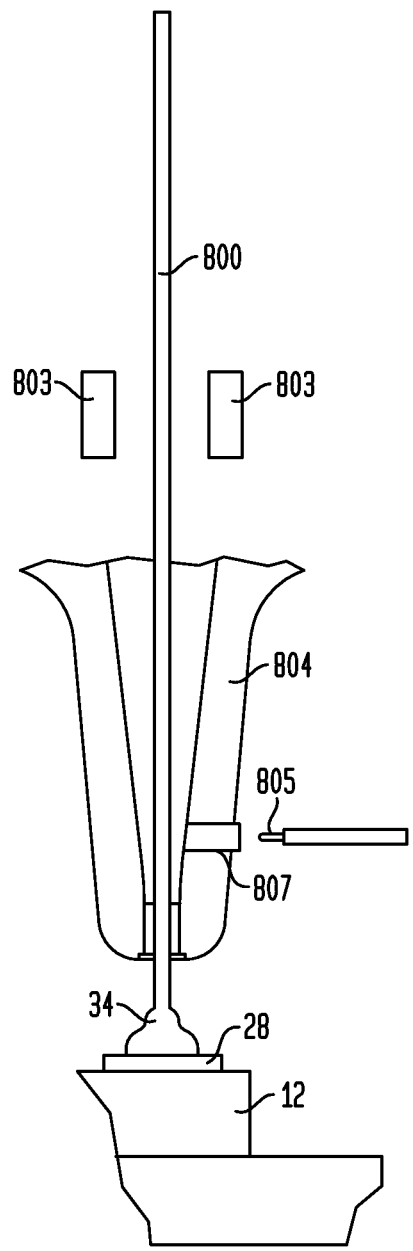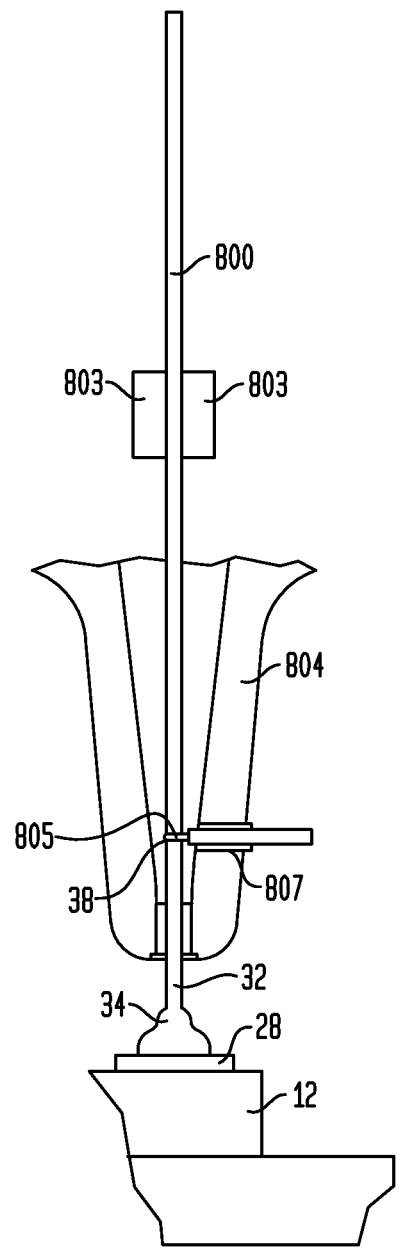

METHOD FOR PACKAGE-ON-PACKAGE ASSEMBLY WITH WIRE BONDS TO ENCAPSULATION SURFACE

CROSS-REFERENCE TO RELATED APPLICATIONS

This application is a national phase entry under 35 U.S.C. §371 of International Application No. PCT/US2013/026126 filed Feb. 14, 2013, which is a continuation of U.S. patent application Ser. No. 13/752,485 filed Jan. 29, 2013, now U.S. Pat. No. 8,772,152, which is a continuation of U.S. patent application Ser. No. 13/405,125 filed Feb. 24, 2012, now U.S. Pat. No. 8,372,741, all of which are hereby incorporated herein by reference.

BACKGROUND OF THE INVENTION

Embodiments of the invention herein relate to various structures and ways of making microelectronic packages which can be used in package-on-package assemblies, and more particularly, to such structures which incorporate wire bonds for as part of the package-on-package connections.

Microelectronic devices such as semiconductor chips typically require many input and output connections to other electronic components. The input and output contacts of a semiconductor chip or other comparable device are generally disposed in grid-like patterns that substantially cover a surface of the device (commonly referred to as an "area array") or in elongated rows which may extend parallel to and adjacent each edge of the device's front surface, or in the center of the front surface. Typically, devices such as chips must be physically mounted on a substrate such as a printed circuit board, and the contacts of the device must be electrically connected to electrically conductive features of the circuit board.

Semiconductor chips are commonly provided in packages that facilitate handling of the chip during manufacture and during mounting of the chip on an external substrate such as a circuit board or other circuit panel. For example, many semiconductor chips are provided in packages suitable for surface mounting. Numerous packages of this general type have been proposed for various applications. Most commonly, such packages include a dielectric element, commonly referred to as a "chip carrier" with terminals formed as plated or etched metallic structures on the dielectric. These terminals typically are connected to the contacts of the chip itself by features such as thin traces extending along the chip carrier itself and by fine leads or wires extending between the contacts of the chip and the terminals or traces. In a surface mounting operation, the package is placed onto a circuit board so that each terminal on the package is aligned with a corresponding contact pad on the circuit board. Solder or other bonding material is provided between the terminals and the contact pads. The package can be permanently bonded in place by heating the assembly so as to melt or "reflow" the solder or otherwise activate the bonding material.

Many packages include solder masses in the form of solder balls, typically about 0.1 mm and about 0.8 mm (5 and 30 mils) in diameter, attached to the terminals of the package. A package having an array of solder balls projecting from its bottom surface is commonly referred to as a ball grid array or "BGA" package. Other packages, referred to as land grid array or "LGA" packages are secured to the substrate by thin layers or lands formed from solder. Packages of this type can be quite compact. Certain packages, commonly referred to as "chip scale packages," occupy an area of the circuit board equal to, or only slightly larger than, the area of the device incorporated in the package. This is advantageous in that it reduces the overall size of the assembly and permits the use of short interconnections between various devices on the substrate, which in turn limits signal propagation time between devices and thus facilitates operation of the assembly at high speeds.

Packaged semiconductor chips are often provided in "stacked" arrangements, wherein one package is provided, for example, on a circuit board, and another package is mounted on top of the first package. These arrangements can allow a number of different chips to be mounted within a single footprint on a circuit board and can further facilitate high-speed operation by providing a short interconnection between packages. Often, this interconnect distance is only slightly larger than the thickness of the chip itself. For interconnection to be achieved within a stack of chip packages, it is necessary to provide structures for mechanical and electrical connection on both sides of each package (except for the topmost package). This has been done, for example, by providing contact pads or lands on both sides of the substrate to which the chip is mounted, the pads being connected through the substrate by conductive vias or the like. Solder balls or the like have been used to bridge the gap between the contacts on the top of a lower substrate to the contacts on the bottom of the next higher substrate. The solder balls must be higher than the height of the chip in order to connect the contacts. Examples of stacked chip arrangements and interconnect structures are provided in U.S. Patent App. Pub. No. 2010/0232129 ("the '129 Publication"), the disclosure of which is incorporated by reference herein in its entirety.

Microcontact elements in the form of elongated posts or pins may be used to connect microelectronic packages to circuit boards and for other connections in microelectronic packaging. In some instances, microcontacts have been formed by etching a metallic structure including one or more metallic layers to form the microcontacts. The etching process limits the size of the microcontacts. Conventional etching processes typically cannot form microcontacts with a large ratio of height to maximum width, referred to herein as "aspect ratio". It has been difficult or impossible to form arrays of microcontacts with appreciable height and very small pitch or spacing between adjacent microcontacts. Moreover, the configurations of the microcontacts formed by conventional etching processes are limited.

Despite all of the above-described advances in the art, still further improvements in making and testing microelectronic packages would be desirable.

BRIEF SUMMARY OF THE INVENTION

A microelectronic assembly may include a substrate having a first and second opposed surfaces. A microelectronic element can overlie the first surface and first electrically conductive elements can be exposed at at least one of the first surface or second surfaces. Some of the first conductive elements may be electrically connected to the microelectronic element. Wire bonds have bases joined to the conductive elements and end surfaces remote from the substrate and the bases. Each wire bond can define an edge surface extending between the base and the end surface. An encapsulation layer can extend from the first surface and fill spaces between the wire bonds, such that the wire bonds can be separated by the encapsulation layer. Unencapsulated portions of the wire bonds may be defined by at least portions of the end surfaces of the wire bonds that are uncovered by the encapsulation layer.

Various package structures are disclosed herein which incorporate wire bonds functioning as vertical connections extending upwardly from conductive elements, e.g., conductive pads on a substrate. Such wire bonds can be used in making package on package electrical connections with a microelectronic package overlying a surface of a dielectric encapsulation. In addition, various embodiments of methods are disclosed herein for making a microelectronic package or a microelectronic assembly.

Thus, a method of making a microelectronic package according to an aspect of the invention can include a) feeding a metal wire segment having a predetermined length out of a capillary of a bonding tool; b) using the bonding tool to bond a portion of the metal wire to a conductive element exposed at a first surface of a substrate, thereby forming a base of a wire bond on the conductive element; c) clamping a portion of the wire within the bonding tool; d) cutting the metal wire at a location between the clamped portion and the base portion to at least partially define an end surface of the wire bond, an edge surface of the wire bond being defined between the base and the end surface; e) repeating steps (a) through (d) to form a plurality of wire bonds to a plurality of the conductive elements of the substrate; and e) then forming a dielectric encapsulation layer overlying the surface of the substrate, wherein the encapsulation layer is formed so as to at least partially cover the surface of the substrate and portions of the wire bonds, such that unencapsulated portions of the wire bonds are defined by a portion of at least one of an end surface or of an edge surface thereof that is uncovered by the encapsulation layer.

Thus, in accordance with an aspect of the invention, a metal wire segment having a predetermined length can be fed out of a capillary of a bonding tool. The bonding tool can be used to bond a portion of the metal wire to a conductive element exposed at a first surface of a substrate. Such bonding can form a base of the wire bond on the conductive element. A portion of the wire can be clamped after forming the bond with the conductive element. The portion of the wire clamped can be within the bonding tool. The metal wire can be cut at a location between the clamped portion and the base portion, and cutting the wire may at least partially define an end surface of the wire bond. An edge surface of the wire bond can be defined between the base and the end surface. The foregoing can be repeated to form a plurality of wire bonds to a plurality of the conductive elements of the substrate. Then, a dielectric encapsulation layer can be formed overlying the surface of the substrate. The encapsulation layer can be formed so as to at least partially cover the surface of the substrate and portions of the wire bonds. Unencapsulated portions of the wire bonds can be defined by a portion of at least one of an end surface or of an edge surface thereof that is uncovered by the encapsulation layer.

In one example, the metal wire can be cut only partially therethrough. The bonding tool can be moved away from the surface of the substrate while the portion of the wire remains clamped. In such process, the wire can be caused to break at the location of the cut. An end surface can be formed by the cut and the break.

In one example, the cut can be made completely through the wire segment in a direction substantially perpendicular to the edge surface of the wire bond. An end surface of the wire bond can be formed by the cut.

In one example, at least one microelectronic element can overlie the first surface of the substrate. The substrate can have a first region and a second region and the microelectronic element can be located within the first region, e.g., as overlying the first region. The conductive elements can be located within the second region, e.g., as conductive elements exposed at the first surface therein. The conductive elements can be electrically connected to the at least one microelectronic element. The dielectric encapsulation layer can be formed overlying the first surface of the substrate in at least the second region thereof, but may overlie at least a portion of the first surface in the first region as well as the second region.

In one example, the package can be configured such that a first wire bond of the wire bonds is adapted for carrying a first signal electric potential and a second wire bond of the wire bonds is adapted for simultaneously carrying a second signal electric potential different from the first signal electric potential.

In one example, the metal wire segment can be cut using a laser mounted on the bonding tool. In such example, the capillary of the bonding tool can define a face thereof through which the wire segment is fed. The laser can be mounted on or with the bonding tool such that a cutting beam can be directed to a location of the wire segment positioned between the face of the bonding tool and the base of the wire bond.

In one example, the bonding tool can include a capillary defining a face thereof through which the wire segment is fed. The capillary may include an opening in a side wall thereof, and the laser can be mounted on or with the bonding tool such that a cutting beam can pass through the opening to a location of the wire segment positioned within the capillary.

In one example, the laser can be one of: C02, Nd:YAG, or a Cu vapor laser.

In one example, the metal wire can be cut using a cutting edge that extends within the capillary. In one example, the cutting edge can extend in a direction toward a wall of the capillary opposite the wire segment. In one example, the metal wire can be cut using the cutting edge as a first cutting edge, and in combination with a second cutting edge that extends within the capillary. The second cutting edge may be positioned in opposition with the first cutting edge.

In one example, the capillary may define a face through which the wire segment can be fed. The metal wire can be cut using a cutting instrument having first and second opposing cutting edges. The cutting instrument can be mounted on or with the bonding tool in such way that the wire can be cut at a location positioned between the face of the bonding tool and the base of the wire bond.

One example of the method may include positioning a stencil over the substrate. The stencil can have a plurality of openings therein that overlie and expose at least portions of the conductive elements. The openings can define respective edges positioned at a first height over the substrate. The wire segment can be cut by lateral movement of the wire against the edge of the stencil opening.

A method of making a microelectronic package according to an aspect of the invention can include: positioning a stencil over an in-process unit including a substrate having a first surface and a second surface remote therefrom. A microelectronic element can be mounted to the first surface of the substrate. A plurality of conductive elements can be exposed at the first surface. In an example, at least some of the conductive elements can be electrically connected to the microelectronic element. The stencil can have a plurality of openings therein that overlie and expose at least portion of the conductive elements. The openings may define respective edges which are positioned at a first height over the substrate.

In accordance with such aspect, the method can include forming a wire bond by a process including feeding a metal wire out of a capillary of a bonding tool such that a predetermined length extends beyond the face of the capillary and defines a metal wire segment. A portion of the wire segment can be joined to a conductive element of the plurality of conductive elements to form a base of the wire bond. At least a portion of the metal wire segment can be sheared from another portion of the wire connected thereto by lateral movement of the wire against the edge of the stencil opening to separate the wire bond from a remaining portion of the wire. The shearing of the metal wire can define an end surface of the wire bond, the wire bond having an edge surface extending between the base and the end surface. The feeding out of the metal wire, bonding, and shearing thereof as described above can be repeated a plurality of times using one or more openings of the stencil to form a plurality of wire bonds on a plurality of the conductive elements.

In an example of such method, a dielectric encapsulation layer can be formed on the in-process unit, wherein the encapsulation layer is formed so as to at least partially cover the first surface and portions of the wire bonds. Unencapsulated portions of the wire bonds can be defined by a portion of at least one of the end surface or of the edge surface thereof which is uncovered by the encapsulation layer.

In an example of such method, a portion of the metal wire which extends beyond a face of the capillary and which remains after the shearing of the metal wire can be of a length sufficient to form at least a base of a subsequent wire bond.

In an example of the method, the stencil can define a thickness in a direction of an axis extending of one of the holes, e.g., in a vertical direction away from a surface of the substrate. Some or all of the holes can have a consistent or constant diameter through the thickness of the stencil.

In an example of the method, the stencil can define a thickness in a direction of an axis of one of the holes or openings, e.g., in a vertical direction away from a surface of the substrate. Some or all of the holes or openings in the stencil can be tapered from a first width or smaller diameter at an exposed edge within the opening to a second larger width or greater diameter at another location within the hole or opening and closer to the substrate.

In one example, the stencil may include an edge member having a first thickness in a direction of thickness of the substrate extending along one or more edges of the substrate. The first thickness can define a first height. A central portion may include the holes or openings and can be bounded by the edge member. The central portion can have an outer surface facing away from the substrate. The outer surface can be disposed at the first height. The central portion can have a thickness which is less than the first thickness.

BRIEF DESCRIPTION OF THE DRAWINGS

FIGS. 16A-16C show a detail view of a portion of a microelectronic package during various steps of fabrication thereof according to an embodiment of the present invention;

FIGS. 17A-17C show a detail view of a portion of a microelectronic package during various steps of fabrication thereof according to an alternative embodiment of the present invention;

FIGS. 32A and 32B show a portion of a machine that can be used in forming various wire bond vias in various stages of a method according to another embodiment of the present disclosure;

DETAILED DESCRIPTION

Figure 1:
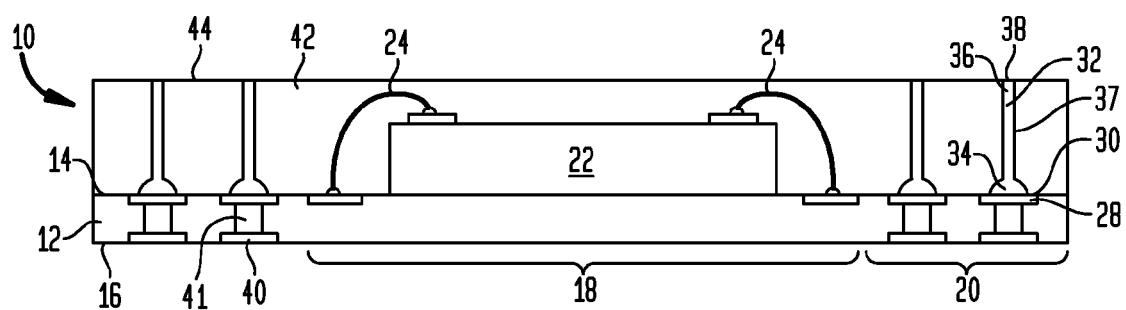
FIG. 1 shows a microelectronic package according to an embodiment of the present invention.

Turning now to the figures, where similar numeric references are used to indicate similar features, there is shown in FIG. 1 a microelectronic assembly 10 according to an embodiment of the present invention. The embodiment of FIG. 1 is a microelectronic assembly in the form of a packaged microelectronic element such as a semiconductor chip assembly that is used in computer or other electronic applications.

The microelectronic assembly 10 of FIG. 1 includes a substrate 12 having a first surface 14 and a second surface 16. The substrate 12 typically is in the form of a dielectric element, which is substantially flat. The dielectric element may be sheet-like and may be thin. In particular embodiments, the dielectric element can include one or more layers of organic dielectric material or composite dielectric materials, such as, without limitation: polyimide, polytetrafluoroethylene ("PTFE"), epoxy, epoxy-glass, FR-4, BT resin, thermoplastic, or thermoset plastic materials. The first surface 14 and second surface 16 are preferably substantially parallel to each other and are spaced apart at a distance perpendicular to the surfaces 14,16 defining the thickness of the substrate 12. The thickness of substrate 12 is preferably within a range of generally acceptable thicknesses for the present application. In an embodiment, the distance between the first surface 14 and the second surface 16 is between about 25 and 500 µm. For purposes of this discussion, the first surface 14 may be described as being positioned opposite or remote from second surface 16. Such a description, as well as any other description of the relative position of elements used herein that refers to a vertical or horizontal position of such elements is made for illustrative purposes only to correspond with the position of the elements within the Figures, and is not limiting.

In a preferred embodiment, substrate 12 is considered as divided into a first region 18 and a second region 20. The first region 18 lies within the second region 20 and includes a central portion of the substrate 12 and extends outwardly therefrom. The second region 20 substantially surrounds the first region 18 and extends outwardly therefrom to the outer edges of the substrate 12. In this embodiment, no specific characteristic of the substrate itself physically divides the two regions; however, the regions are demarked for purposes of discussion herein with respect to treatments or features applied thereto or contained therein.

A microelectronic element 22 can be mounted to first surface 14 of substrate 12 within first region 18. Microelectronic element 22 can be a semiconductor chip or another comparable device. In the embodiment of FIG. 1, microelectronic element 22 is mounted to first surface 14 in what is known as a conventional or "face-up" fashion. In such an embodiment, wire leads 24 can be used to electrically connect microelectronic element 22 to some of a plurality of conductive elements 28 exposed at first surface 14. Wire leads 24 can also be joined to traces (not shown) or other conductive features within substrate 12 that are, in turn, connected to conductive elements 28.

Figure 22:
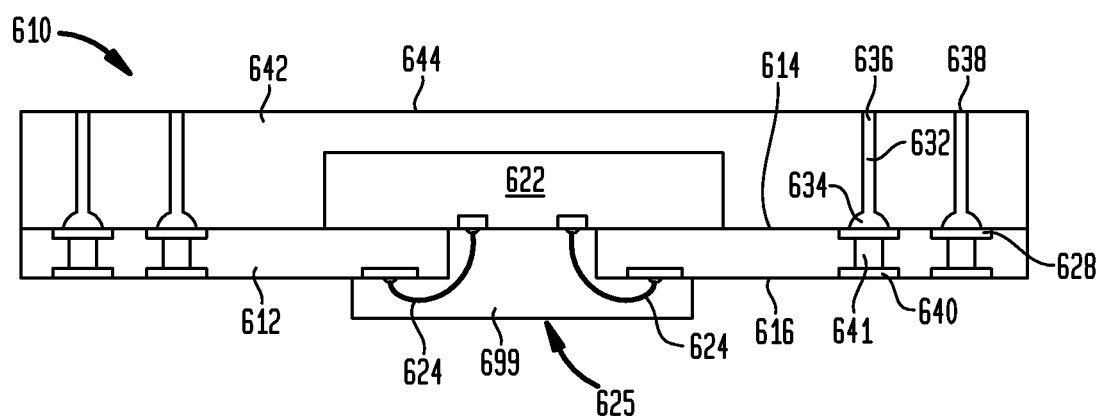
FIG. 22 shows a front elevation view of a microelectronic package according to a further alternative embodiment of the present invention.

Conductive elements 28 include respective "contacts" or pads 30 that are exposed at the first surface 14 of substrate 12. As used in the present description, when an electrically conductive element is described as being "exposed at" the surface of another element having dielectric structure, it indicates that the electrically conductive structure is available for contact with a theoretical point moving in a direction perpendicular to the surface of the dielectric structure toward the surface of the dielectric structure from outside the dielectric structure. Thus, a terminal or other conductive structure that is exposed at a surface of a dielectric structure may project from such surface; may be flush with such surface; or may be recessed relative to such surface and exposed through a hole or depression in the dielectric. The conductive elements 28 can be flat, thin elements in which pad 30 is exposed at first surface 14 of substrate 12. In one embodiment, conductive elements 28 can be substantially circular and can be interconnected between each other or to microelectronic element 22 by traces (not shown). Conductive elements 28 can be formed at least within second region 20 of substrate 12. Additionally, in certain embodiments, conductive elements 28 can also be formed within first region 18. Such an arrangement is particularly useful when mounting microelectronic element 122 (FIG. 3) to substrate 112 in what is known as a "flip-chip" configuration, where contacts on the microelectronic element 122 can be connected to conductive elements 128 within first region 118 by solder bumps 126 or the like that are positioned beneath microelectronic element 122. In another configuration as shown in FIG. 22, microelectronic element 622 is mounted face-down on substrate 612 and electrically connected to a conductive feature on the chip by wire leads 624 that extend over an outwardly-facing surface, such as surface 616, of substrate 612. In the embodiment shown, wire leads 625 pass through an opening 625 in substrate 612 and can be encapsulated by an overmold 699.

In an embodiment, conductive elements 28 are formed from a solid metal material such as copper, gold, nickel, or other materials that are acceptable for such an application, including various alloys including one or more of copper, gold, nickel or combinations thereof.

At least some of conductive elements 28 can be interconnected to corresponding second conductive elements 40, such as conductive pads, exposed at second surface 16 of substrate 12. Such an interconnection can be completed using vias 41 formed in substrate 12 that can be lined or filled with conductive metal that can be of the same material as conductive elements 28 and 40. Optionally, conductive elements 40 can be further interconnected by traces on substrate 12.

Microelectronic assembly 10 further includes a plurality of wire bonds 32 joined to at least some of the conductive elements 28, such as on the pads 30 thereof. Wire bonds 32 are joined at a base 34 thereof to the conductive elements 28 and can extend to a free end 36 remote from the respective bases 34 and from substrate 12. The ends 36 of wire bonds 32 are characterized as being free in that they are not electrically connected or otherwise joined to microelectronic element 22 or any other conductive features within microelectronic assembly 10 that are, in turn, connected to microelectronic element 22. In other words, free ends 36 are available for electronic connection, either directly or indirectly as through a solder ball or other features discussed herein, to a conductive feature external to assembly 10. The fact that ends 36 held in a predetermined position by, for example, encapsulant layer 42 or otherwise joined or electrically connected to another conductive feature does not mean that they are not "free" as described herein, so long as any such feature is not electrically connected to microelectronic element 22. Conversely, base 34 is not free as it is either directly or indirectly electrically connected to microelectronic element 22, as described herein. As shown in FIG. 1, base 34 can be substantially rounded in shape, extending outward from an edge surface 37 of wire bond 32 defined between base 34 and end 36. The particular size and shape of base 34 can vary according to the type of material used to form wire bond 32, the desired strength of the connection between wire bond 32 and conductive element 28, or the particular process used to form wire bond 32. Exemplary methods for making wire bonds 28 are described in U.S. Pat. No. 7,391,121 to Otremba and in U.S. Pat. App. Pub. No. 2005/0095835 (describing a wedge-bonding procedure that can be considered a form of wire bonding) the disclosures of which are both incorporated herein by reference in their entireties. Alternative embodiments are possible where wire bonds 32 are additionally or alternatively joined to conductive elements 40 exposed on second surface 16 of substrate 12, extending away therefrom.

Wire bond 32 can be made from a conductive material such as copper, gold, nickel, solder, aluminum or the like. Additionally, wire bonds 32 can be made from combinations of materials, such as from a core of a conductive material, such as copper or aluminum, for example, with a coating applied over the core. The coating can be of a second conductive material, such as aluminum, nickel or the like. Alternatively, the coating can be of an insulating material, such as an insulating jacket. In an embodiment, the wire used to form wire bonds 32 can have a thickness, i.e., in a dimension transverse to the wire's length, of between about 15 µm and 150 µm. In other embodiments, including those in which wedge bonding is used, wire bonds 32 can have a thickness of up to about 500 µm. In general, a wire bond is formed on a conductive element, such as conductive element 28, a pad, trace or the like, using specialized equipment that is known in the art. A leading end of a wire segment is heated and pressed against the receiving surface to which the wire segment bonds, typically forming a ball or ball-like base 34 joined to the surface of the conductive element 28. The desired length of the wire segment to form the wire bond is drawn out of the bonding tool, which can then cut the wire bond at the desired length. Wedge bonding, which can be used to form wire bonds of aluminum, for example, is a process in which the heated portion of the wire is dragged across the receiving surface to form a wedge that lies generally parallel to the surface. The wedge-bonded wire bond can then be bent upward, if necessary, and extended to the desired length or position before cutting. In a particular embodiment, the wire used to form a wire bond can be cylindrical in cross-section. Otherwise, the wire fed from the tool to form a wire bond or wedge-bonded wire bond may have a polygonal cross-section such as rectangular or trapezoidal, for example.

Figure 2:
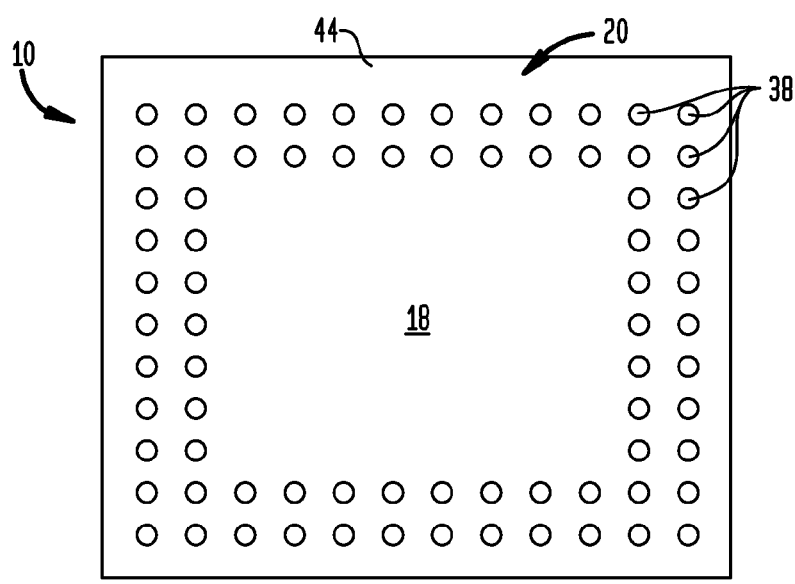
FIG. 2 shows a top elevation view of the microelectronic package of FIG. 1.
Figure 6:
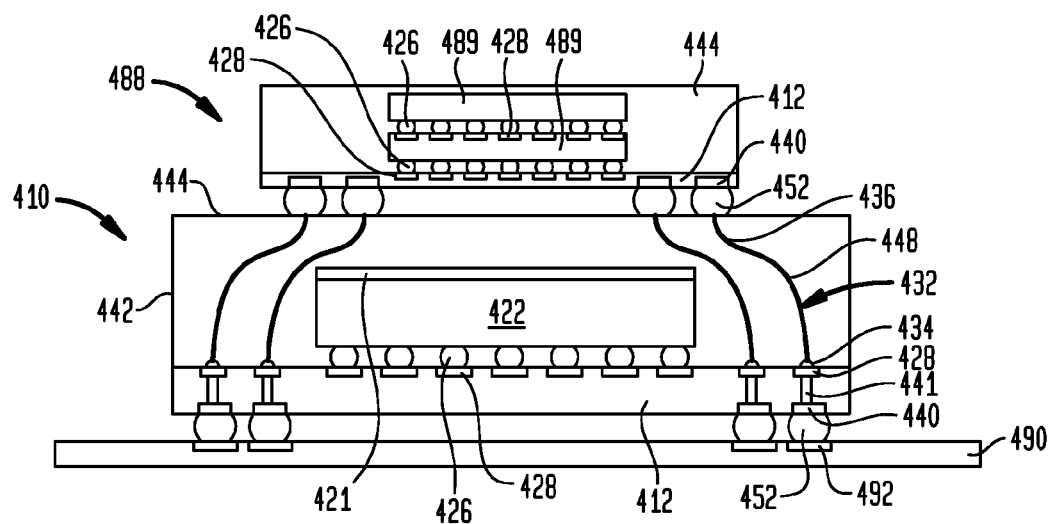
FIG. 6 shows a stacked microelectronic assembly including a microelectronic package according to an embodiment of the present invention.

The free end 36 of wire bond 32 has an end surface 38. End surface 38 can form at least a part of a contact in an array formed by respective end surfaces 38 of a plurality of wire bonds 32. FIG. 2 shows an exemplary pattern for such an array of contacts formed by end surfaces 38. Such an array can be formed in an area array configuration, variations of which could be implemented using the structures described herein. Such an array can be used to electrically and mechanically connect the microelectronic assembly 10 to another microelectronic structure, such as to a printed circuit board ("PCB"), or to other packaged microelectronic elements, an example of which is shown in FIG. 6. In such a stacked arrangement, wire bonds 32 and conductive elements 28 and 40 can carry multiple electronic signals therethrough, each having a different signal potential to allow for different signals to be processed by different microelectronic elements in a single stack. Solder masses 52 can be used to interconnect the microelectronic assemblies in such a stack, such as by electronically and mechanically attaching end surfaces 38 to conductive elements 40.

Microelectronic assembly 10 further includes an encapsulation layer 42 formed from a dielectric material. In the embodiment of FIG. 1, encapsulation layer 42 is formed over the portions of first surface 14 of substrate 12 that are not otherwise covered by or occupied by microelectronic element 22, or conductive elements 28. Similarly, encapsulation layer 42 is formed over the portions of conductive elements 28, including pad 30 thereof, that are not otherwise covered by wire bonds 32. Encapsulation layer 42 can also substantially cover microelectronic element 22, wire bonds 32, including the bases 34 and at least a portion of edge surfaces 37 thereof. A portion of wire bonds 32 can remain uncovered by encapsulation layer 42, which can also be referred to as unencapsulated, thereby making the wire bond available for electrical connection to a feature or element located outside of encapsulation layer 42. In an embodiment, end surfaces 38 of wire bonds 32 remain uncovered by encapsulation layer 42 within major surface 44 of encapsulation layer 42. Other embodiments are possible in which a portion of edge surface 37 is uncovered by encapsulation layer 42 in addition to or as an alternative to having end surface 38 remain uncovered by encapsulation layer 42. In other words, encapsulation layer 42 can cover all of microelectronic assembly 10 from first surface 14 and above, with the exception of a portion of wire bonds 36, such as end surfaces 38, edge surfaces 37 or combinations of the two. In the embodiments shown in the Figures, a surface, such as major surface 44 of encapsulation layer 42 can be spaced apart from first surface 14 of substrate 12 at a distance great enough to cover microelectronic element 22. Accordingly, embodiments of microelectronic assembly 10 in which ends 38 of wire bonds 32 are flush with surface 44, will include wire bonds 32 that are taller than the microelectronic element 22, and any underlying solder bumps for flip chip connection. Other configurations for encapsulation layer 42, however, are possible. For example, the encapsulation layer can have multiple surfaces with varying heights. In such a configuration, the surface 44 within which ends 38 are positioned can be higher or lower than an upwardly facing surface under which microelectronic element 22 is located.

Encapsulation layer 42 serves to protect the other elements within microelectronic assembly 10, particularly wire bonds 32. This allows for a more robust structure that is less likely to be damaged by testing thereof or during transportation or assembly to other microelectronic structures. Encapsulation layer 42 can be formed from a dielectric material with insulating properties such as that described in U.S. Patent App. Pub. No. 2010/0232129, which is incorporated by reference herein in its entirety.

Figure 3:
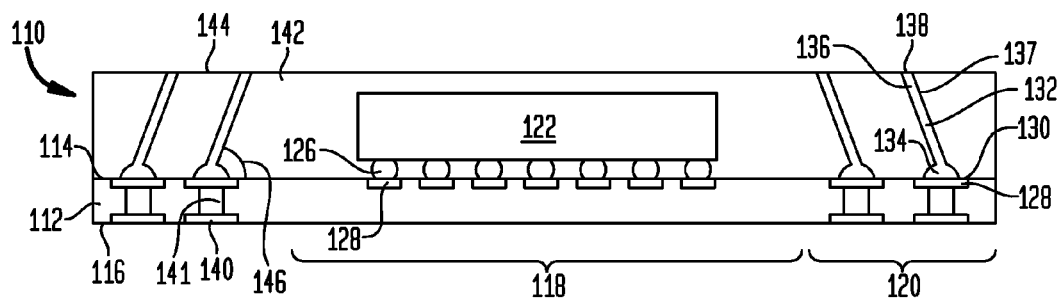
FIG. 3 shows a microelectronic package according to an alternative embodiment of the present invention.

FIG. 3 shows an embodiment of microelectronic assembly 110 having wire bonds 132 with ends 136 that are not positioned directly above the respective bases 34 thereof. That is, considering first surface 114 of substrate 112 as extending in two lateral directions, so as to substantially define a plane, end 136 or at least one of the wire bonds 132 is displaced in at least one of these lateral directions from a corresponding lateral position of base 134. As shown in FIG. 3, wire bonds 132 can be substantially straight along the longitudinal axis thereof, as in the embodiment of FIG. 1, with the longitudinal axis being angled at an angle 146 with respect to first surface 114 of substrate 112. Although the cross-sectional view of FIG. 3 only shows the angle 146 through a first plane perpendicular to first surface 114, wire bond 132 can also be angled with respect to first surface 114 in another plane perpendicular to both that first plane and to first surface 114. Such an angle can be substantially equal to or different than angle 146. That is the displacement of end 136 relative to base 134 can be in two lateral directions and can be by the same or a different distance in each of those directions.

Figure 19:
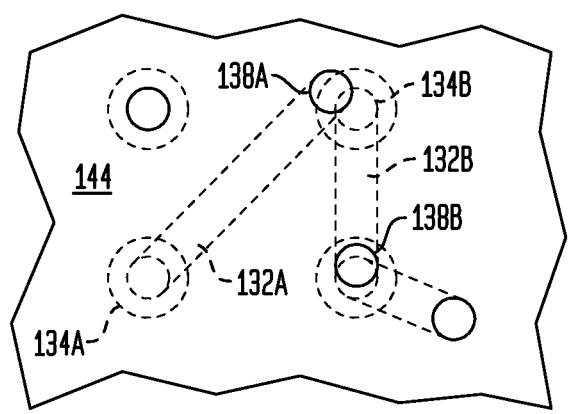
FIG. 19 shows a top elevation view of a portion of a microelectronic package according to an alternative embodiment of the present invention.

In an embodiment, various ones of wire bonds 132 can be displaced in different directions and by different amounts throughout the assembly 110. Such an arrangement allows for assembly 110 to have an array that is configured differently on the level of surface 144 compared to on the level of substrate 12. For example, an array can cover a smaller overall area or have a smaller pitch on surface 144 than at the first surface 114 level compared to that at first surface 114 of substrate 112. Further, some wire bonds 132 can have ends 136 that are positioned above microelectronic element 122 to accommodate a stacked arrangement of packaged microelectronic elements of different sizes. In another example, shown in FIG. 19, wire bonds 132 can be configured such that the end surface 138A of one wire bond 132A is positioned substantially above the base 134B of another wire bond 132B, the end surface 138B of that wire bond 132B being positioned elsewhere. Such an arrangement can be referred to as changing the relative position of a contact end surface 138 within an array of contacts, compared to the position of a corresponding contact array on second surface 116. Within such an array, the relative positions of the contact end surfaces can be changed or varied, as desired, depending on the microelectronic assembly's application or other requirements.

Figure 30:
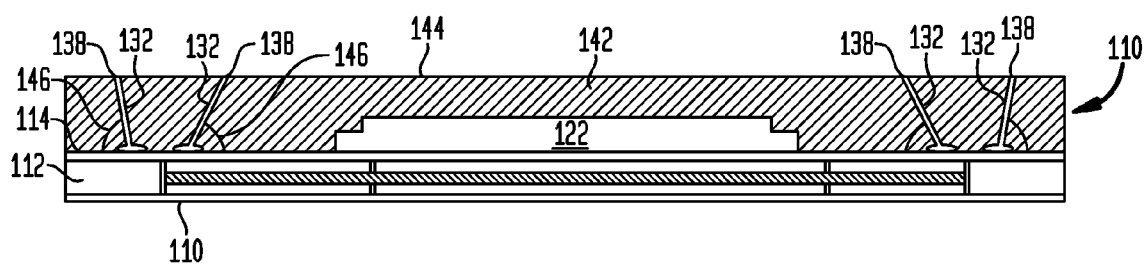
FIG. 30 shows a sectional view of a microelectronic package according to another embodiment.

In a further example shown in FIG. 30, the wire bonds 132 can be arranged such that the bases 134 are arranged in a first pattern having a pitch thereof. The wire bonds 132 can be configured such that the unencapsulated portions thereof 139, including end surfaces 138 can be disposed in a pattern at positions at a major surface 144 of the encapsulation layer 142 which have a minimum pitch that is greater than a minimum pitch between the respective adjacent bases 134 of the wire bonds attached to conductive elements 128. Accordingly, the minimum pitch between adjacent wire bonds at the encapsulation surface 146 can be greater than the corresponding minimum pitch between the conductive elements 128 of the substrate to which the wire bonds are attached.

Figure 4:
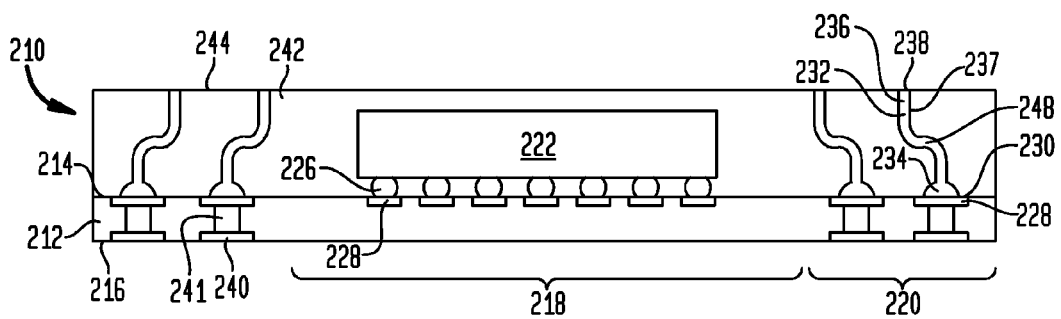
FIG. 4 shows a microelectronic package according to an alternative embodiment of the present invention.

To achieve this, the wire bonds can be angled, as shown in FIG. 30, or can be curved as shown, for example in FIG. 4, such that the end surfaces 138 are displaced in one or more lateral directions from the bases 134, as discussed above. As further shown in FIG. 30, the conductive elements 128 and the end surfaces 138 can be arranged in respective rows or columns and the lateral displacement of end surfaces 138 in one row can be greater than in another row. To achieve this, the wire bonds 132 can, for example be at different angles 146A, 146B with respect to the surface 116 of the substrate 112.

FIG. 4 shows a further embodiment of a microelectronic subassembly 210 having wire bonds 232 with ends 236 in displaced lateral positions with respect to bases 234. In the embodiment of FIG. 4, the wire bonds 132 achieve this lateral displacement by including a curved portion 248 therein. Curved portion 248 can be formed in an additional step during the wire bond formation process and can occur, for example, while the wire portion is being drawn out to the desired length. This step can be carried out using available wire-bonding equipment, which can include the use of a single machine.

Figure 5:
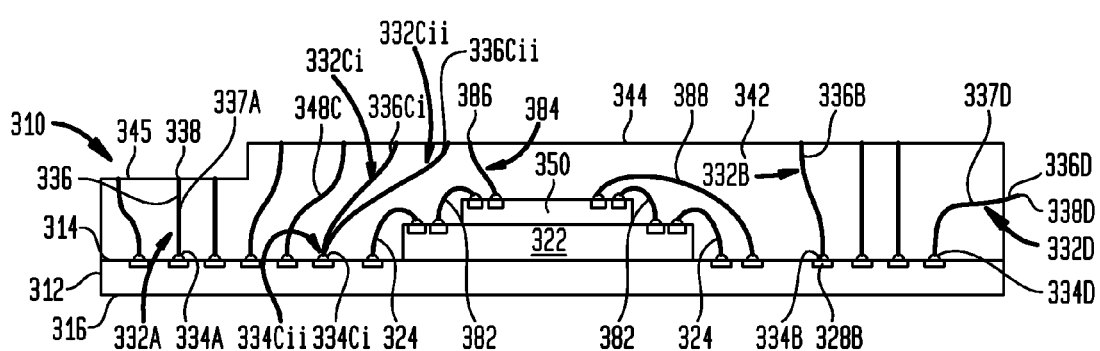
FIG. 5 shows a microelectronic package according to an alternative embodiment of the present invention.

Curved portion 248 can take on a variety of shapes, as needed, to achieve the desired positions of the ends 236 of the wire bonds 232. For example, curved portions 248 can be formed as S-curves of various shapes, such as that which is shown in FIG. 4 or of a smoother form (such as that which is shown in FIG. 5). Additionally, curved portion 248 can be positioned closer to base 234 than to end 236 or vice-versa. Curved portion 248 can also be in the form of a spiral or loop, or can be compound including curves in multiple directions or of different shapes or characters.

FIG. 5 shows a further exemplary embodiment of a microelectronic package 310 having a combination of wire bonds 332 having various shapes leading to various relative lateral displacements between bases 334 and ends 336. Some of wire bonds 332A are substantially straight with ends 336A positioned above their respective bases 334A, while other wire bonds 332B include a subtle curved portion 348B leading to a somewhat slight relative lateral displacement between end 336B and base 334B. Further, some wire bonds 332C include curved portions 348C having a sweeping shape that result in ends 336C that are laterally displaced from the relative bases 334C at a greater distance than that of ends 334B. FIG. 5 also shows an exemplary pair of such wire bonds 332Ci and 332Cii that have bases 334Ci and 334Cii positioned in the same row of a substrate-level array and ends 336Ci and 336Cii that are positioned in different rows of a corresponding surface-level array.

A further variation of a wire bond 332D is shown that is configured to be uncovered by encapsulation layer 342 on a side surface 47 thereof. In the embodiment shown free end 336D is uncovered, however, a portion of edge surface 337D can additionally or alternatively be uncovered by encapsulation layer 342. Such a configuration can be used for grounding of microelectronic assembly 10 by electrical connection to an appropriate feature or for mechanical or electrical connection to other featured disposed laterally to microelectronic assembly 310. Additionally, FIG. 5 shows an area of encapsulation layer 342 that has been etched away, molded, or otherwise formed to define a recessed surface 345 that is positioned closer to substrate 12 than major surface 342. One or more wire bonds, such as wire bond 332A can be uncovered within an area along recessed surface 345. In the exemplary embodiment shown in FIG. 5, end surface 338A and a portion of edge surface 337A are uncovered by encapsulation layer 342. Such a configuration can provide a connection, such as by a solder ball or the like, to another conductive element by allowing the solder to wick along edge surface 337A and join thereto in addition to joining to end surface 338. Other configurations by which a portion of a wire bond can be uncovered by encapsulation layer 342 along recessed surface 345 are possible, including ones in which the end surfaces are substantially flush with recessed surface 345 or other configurations shown herein with respect to any other surfaces of encapsulation layer 342. Similarly, other configurations by which a portion of wire bond 332D is uncovered by encapsulation layer 342 along side surface 347 can be similar to those discussed elsewhere herein with respect to the variations of the major surface of the encapsulation layer.

FIG. 5 further shows a microelectronic assembly 310 having two microelectronic elements 322 and 350 in an exemplary arrangement where microelectronic element 350 is stacked, face-up, on microelectronic element 322. In this arrangement, leads 324 are used to electrically connect microelectronic element 322 to conductive features on substrate 312. Various leads are used to electronically connect microelectronic element 350 to various other features of microelectronic assembly 310. For example, lead 380 electrically connects microelectronic element 350 to conductive features of substrate 312, and lead 382 electrically connects microelectronic element 350 to microelectronic element 322. Further, wire bond 384, which can be similar in structure to various ones of wire bonds 332, is used to form a contact surface 386 on the surface 344 of encapsulation layer 342 that electrically connected to microelectronic element 350. This can be used to directly electrically connect a feature of another microelectronic assembly to microelectronic element 350 from above encapsulation layer 342. Such a lead could also be included that is connected to microelectronic element 322, including when such a microelectronic element is present without a second microelectronic element 350 affixed thereon. An opening (not shown) can be formed in encapsulation layer 342 that extends from surface 344 thereof to a point along, for example, lead 380, thereby providing access to lead 380 for electrical connection thereto by an element located outside surface 344. A similar opening can be formed over any of the other leads or wire bonds 332, such as over wire bonds 332C at a point away from the ends 336C thereof. In such an embodiment, ends 336C can be positioned beneath surface 344, with the opening providing the only access for electrical connection thereto.

FIG. 6 shows a stacked package of microelectronic assemblies 410 and 488. In such an arrangement solder masses 452 electrically and mechanically connect end surfaces 438 of assembly 410 to conductive elements 440 of assembly 488. The stacked package can include additional assemblies and can be ultimately attached to contacts 492 on a PCB 490 or the like for use in an electronic device. In such a stacked arrangement, wire bonds 432 and conductive elements 430 can carry multiple electronic signals therethrough, each having a different signal potential to allow for different signals to be processed by different microelectronic elements, such as microelectronic element 422 or microelectronic element 489, in a single stack.

Figure 18:
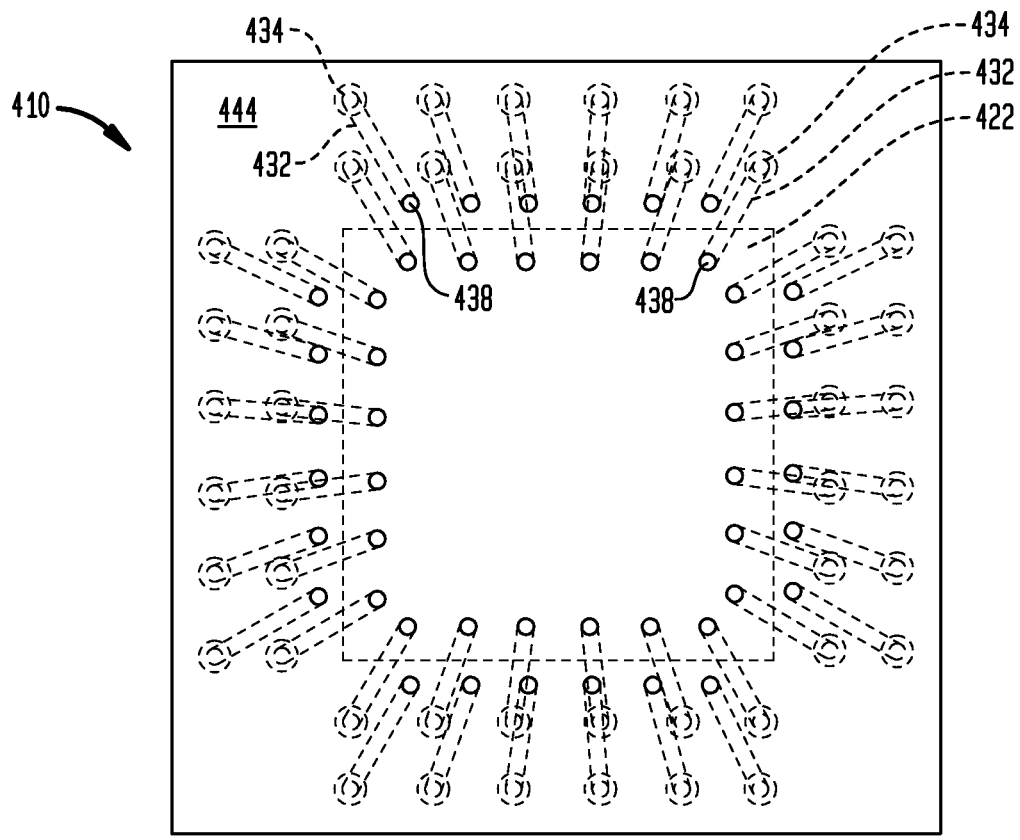
FIG. 18 shows a top elevation view of a microelectronic package according to an alternative embodiment of the present invention.

In the exemplary configuration in FIG. 6, wire bonds 432 are configured with a curved portion 448 such that at least some of the ends 436 of the wire bonds 432 extend into an area that overlies a major surface 424 of the microelectronic element 422. Such an area can be defined by the outer periphery of microelectronic element 422 and extending upwardly therefrom. An example of such a configuration is shown from a view facing toward first surface 414 of substrate 412 in FIG. 18, where wire bonds 432 overlie a rear major surface of the microelectronic element 422, which is flip-chip bonded at a front face 425 thereof to substrate 412. In another configuration (FIG. 5), the microelectronic element 422 can be mounted face-up to the substrate 312, with the front face 325 facing away from the substrate 312 and at least one wire bond 336 overlying the front face of microelectronic element 322. In one embodiment, such wire bond 336 is not electrically connected with microelectronic element 322. A wire bond 336 bonded to substrate 312 may also overlie the front or rear face of microelectronic element 350. The embodiment of microelectronic assembly 410 shown in FIG. 18 is such that conductive elements 428 are arranged in a pattern forming a first array in which the conductive elements 428 are arranged in rows and columns surrounding microelectronic element 422 and may have a predetermined pitch between individual conductive elements 428. Wire bonds 432 are joined to the conductive elements 428 such that the respective bases 434 thereof follow the pattern of the first array as set out by the conductive elements 428. Wire bonds 432 are configured, however, such that the respective ends 436 thereof can be arranged in a different pattern according to a second array configuration. In the embodiment shown the pitch of the second array can be different from, and in some cases finer than that of the first array. However, other embodiments are possible in which the pitch of the second array is greater than the first array, or in which the conductive elements 428 are not positioned in a predetermined array but the ends 436 of the wire bonds 432 are. Further still, conductive elements 428 can be configured in sets of arrays positioned throughout substrate 412 and wire bonds 432 can be configured such that ends 436 are in different sets of arrays or in a single array.

FIG. 6 further shows an insulating layer 421 extending along a surface of microelectronic element 422. Insulating layer 421 can be formed from a dielectric or other electrically insulating material prior to forming the wire bonds. The insulating layer 421 can protect microelectronic element from coming into contact with any of wire bonds 423 that extend thereover. In particular, insulating layer 421 can avoid electrical short-circuiting between wire bonds and short-circuiting between a wire bond and the microelectronic element 422. In this way, the insulating layer 421 can help avoid malfunction or possible damage due to unintended electrical contact between a wire bond 432 and the microelectronic element 422.

The wire bond configuration shown in FIGS. 6 and 18 can allow for microelectronic assembly 410 to connect to another microelectronic assembly, such as microelectronic assembly 488, in certain instances where the relative sizes of, for example, microelectronic assembly 488 and microelectronic element 422 would not otherwise permit. In the embodiment of FIG. 6 microelectronic assembly 488 is sized such that some of the contact pads 440 are in an array within an area smaller than the area of the front or rear surface 424 or 426 of the microelectronic element 422. In a microelectronic assembly having substantially vertical conductive features, such as pillars, in place of wire bonds 432, direct connection between conductive elements 428 and pads 440 would not be possible. However, as shown in FIG. 6, wire bonds 432 having appropriately-configured curved portions 448 can have ends 436 in the appropriate positions to make the necessary electronic connections between microelectronic assembly 410 and microelectronic assembly 488. Such an arrangement can be used to make a stacked package where microelectronic assembly 418 is, for example, a DRAM chip or the like having a predetermined pad array, and wherein microelectronic element 422 is a logic chip configured to control the DRAM chip. This can allow a single type of DRAM chip to be used with several different logic chips of varying sizes, including those which are larger than the DRAM chip because the wire bonds 432 can have ends 436 positioned wherever necessary to make the desired connections with the DRAM chip. In an alternative embodiment, microelectronic package 410 can be mounted on printed circuit board 490 in another configuration, where the unencapsulated surfaces 436 of wire bonds 432 are electrically connected to pads 492 of circuit board 490. Further, in such an embodiment, another microelectronic package, such as a modified version of package 488 can be mounted on package 410 by solder balls 452 joined to pads 440.

Figure 31A:
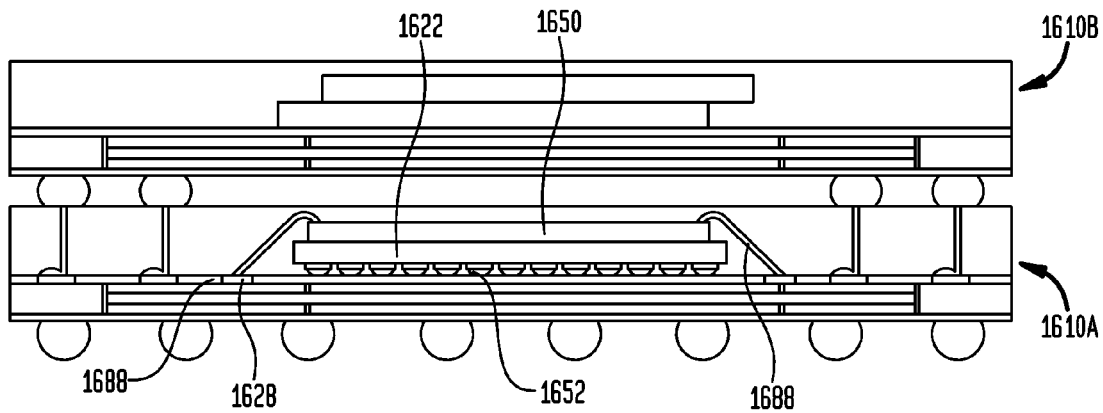
FIGS. 31A-C are sectional views showing examples of embodiments of microelectronic packages according to further embodiments.
Figure 31B:
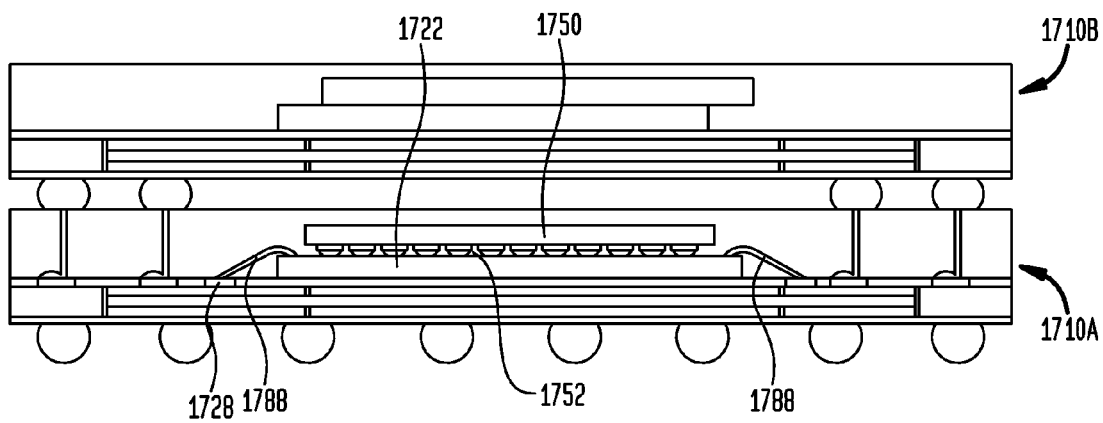
Figure 31C:
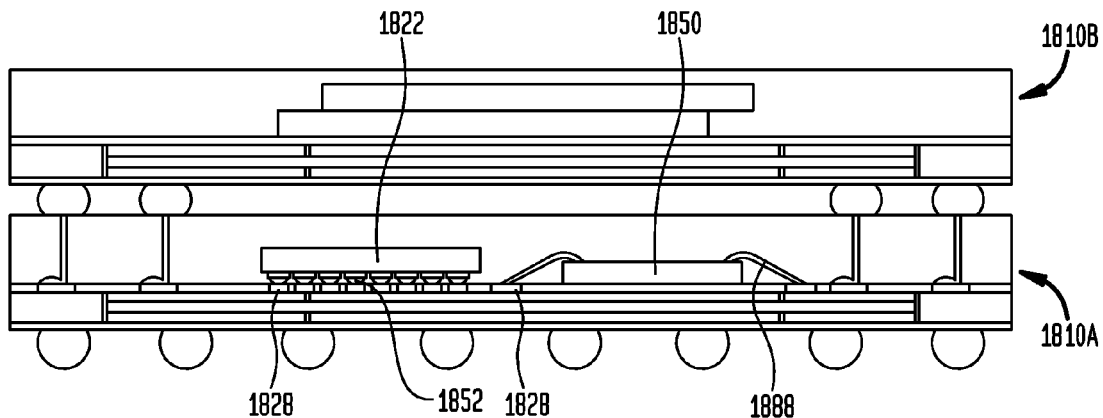

Additional arrangements for microelectronic packages having multiple microelectronic elements are shown in FIGS. 31A-C. These arrangements can be used in connection with the wire bond arrangements shown, for example in FIG. 5 and in the stacked package arrangement of FIG. 6, discussed further below. Specifically, FIG. 31A shows an arrangement in which a lower microelectronic element 1622 is flip-chip bonded to conductive elements 1628 on the surface 1614 of substrate 1612. The second microelectronic element 1650 is face-up mounted on top of the first microelectronic element 1622 and connected through wire bonds 1688 to additional conductive elements 1628. FIG. 31B shows an arrangement where a first microelectronic element 1722 is face-up mounted on surface 1714 and connected through wire bonds 1788 to conductive elements 1728. Second microelectronic element 1750 is flip-chip mounted on top of first microelectronic element 1722 through a set of contacts 1726 of the second microelectronic element 1750 which face and are joined to corresponding contacts on the front face of the first microelectronic element 1722. These contacts on the first microelectronic element 1722 in turn can be connected through circuit patterns of the first microelectronic element 1722 and be connected by some of the ire bonds 1788 to the conductive elements 1728 on substrate 1712.

FIG. 31C shows an arrangement where first 1822 and second 1850 microelectronic elements are mounted side-by-side on surface 1814 of substrate 1812. Either one or both of the microelectronic elements (and additional microelectronic elements) can be mounted in the face-up or flip-chip configurations described herein. Further, any of the microelectronic elements employed in such an arrangement can be connected to each other through circuit patterns on one or both such microelectronic elements or on the substrate or on both, which electrically connect respective conductive elements 1828 to which the microelectronic elements are electrically connected.

Figure 7:
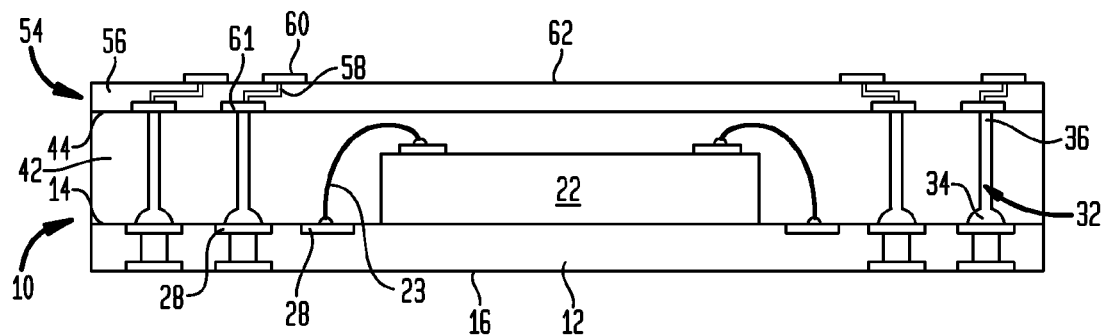
FIG. 7 shows a microelectronic package according to an alternative embodiment of the present invention.

FIG. 7 shows a microelectronic assembly 10, of the type shown in FIG. 1 with a redistribution layer 54 extending along surface 44 of encapsulation layer 42. As shown in FIG. 7, traces 58 are electrically connected to inner contact pads 61 which are electrically connected to end surfaces 38 of wire bonds 32 and extend through the substrate 56 of redistribution layer 54 to contact pads 60 exposed on surface 62 of substrate 56. An additional microelectronic assembly can then be connected to contact pads 60 by solder masses or the like. A similar structure to redistribution layer 54 can extend along second surface 16 of substrate 12 in what is known as a fan-out layer. A fan-out layer can allow microelectronic assembly 10 to connect to an array of a different configuration than the conductive element 40 array would otherwise permit.

Figure 8A:
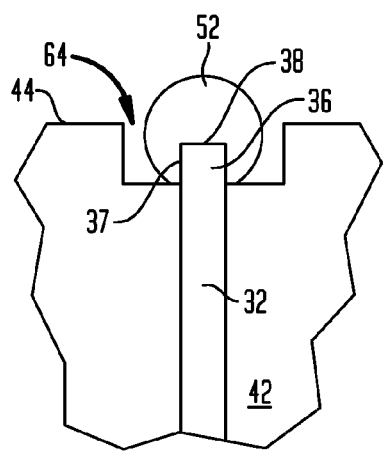
FIGS. 8A-8E show a detail view of a portion of a microelectronic package according to various embodiments of the present invention.
Figure 8B:
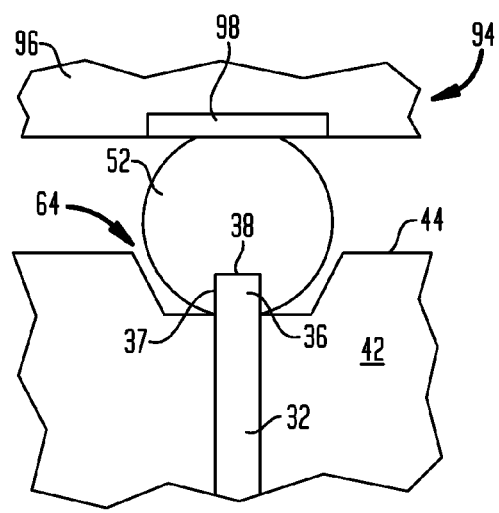

FIGS. 8A-8E show various configurations that can be implemented in the structure of or near the ends 36 of wire bonds 32 in a structure similar to FIGS. 1-7. FIG. 8A shows a structure in which a cavity 64 is formed in a portion of encapsulation layer 42 such that an end 36 of wire bond 32 projects above a minor surface 43 of the encapsulation layer at cavity 64. In the embodiment shown, end surface 38 is positioned below major surface 44 of encapsulation layer 42, and cavity 64 is structured to expose end surface 38 at surface 44 to allow an electronic structure to connect thereto. Other embodiments are possible wherein end surface 38 is substantially even with surface 44 or is spaced above surface 44. Further, cavity 64 can be configured such that a portion of edge surface 37 of wire bond 32 near the end 36 thereof can be uncovered by encapsulation layer 42 within cavity 64. This can allow for a connection to wire bond 32 from outside of assembly 10, such as a solder connection, to be made from both end surface 38 and the uncovered portion of edge surface 37 near end 36. Such a connection is shown in FIG. 8B and can provide a more robust connection to a second substrate 94 using a solder mass 52. In an embodiment cavity 64 can have a depth beneath surface 44 of between about 10 μm and 50 μm and can have a width of between about 100 μm and 300 μm. FIG. 8B shows a cavity having a similar structure to that of FIG. 8A, but with tapered side walls 65. Further, FIG. 8B shows a second microelectronic assembly 94 electrically and mechanically connected to wire bond 32 by a solder mass 52 at a contact pad 96 exposed at a surface of a substrate 98 thereof.

Cavity 64 can be formed by removing a portion of encapsulation layer 42 in the desired area of cavity 64. This can be done by known processes including, laser etching, wet etching, lapping or the like. Alternatively, in an embodiment where encapsulation layer 42 is formed by injection molding, cavity 64 can be formed by including a corresponding feature in the mold. Such a process is discussed in U.S. Pat. App. Pub. No. 2010/0232129, which is hereby incorporated by reference in its entirety. The tapered shape of cavity 64 shown in FIG. 8B can be the result of a particular etching process used in its formation.

Figure 8C:
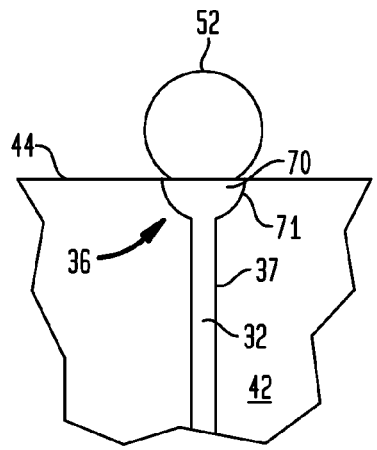
Figure 8D:
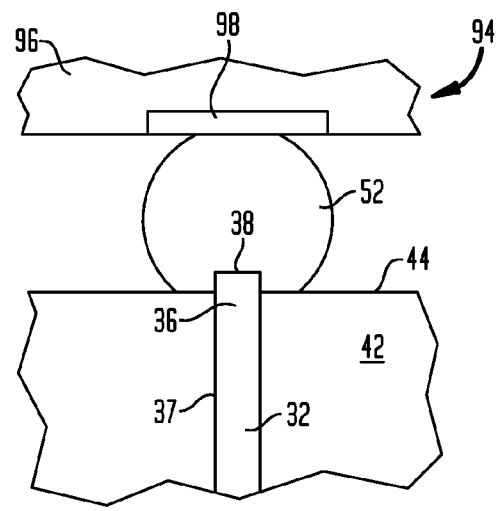
Figure 8E:
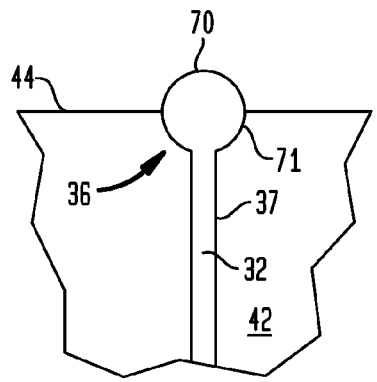

FIGS. 8C and 8E show end structures that include a substantially rounded end portion 70 on wire bond 32. Rounded end portion 70 is configured to have a cross-section that is wider than the cross-section of the portion of wire bond 32 between base 34 and end 36. Further rounded end portion 70 includes an edge surface 71 that extends outward from the edge surface 37 of wire bond 32 at the transition therebetween. The incorporation of a rounded edge portion 70 can act to secure wire bond 32 within encapsulation layer 42 by providing an anchoring feature wherein the change in direction of the surface 71 gives encapsulation layer 42 a location to surround end 70 on three sides. This can help prevent wire bond 32 from becoming detached from conductive elements 28 on substrate 12, resulting in a failed electrical connection. Additionally, the rounded end portion 70 can provide increased surface area that is uncovered by encapsulation layer 42 within surface 44 to which an electronic connection can be made. As shown in FIG. 8E, rounded end portion 70 can extend above surface 44. Alternatively, as shown in FIG. 8C, rounded end portion 70 can further, be ground or otherwise flattened to provide a surface that is substantially flush with surface 44 and can have an area greater than the cross-section of wire bond 32.

A rounded end portion 70 can be formed by applying localized heat in the form of a flame or a spark at the end of the wire used to make wire bond 32. Known wire bonding machines can be modified to carry out this step, which can be done immediately after cutting the wire. In this process, the heat melts the wire at the end thereof. This localized portion of liquid metal is made round by the surface tension thereof and is retained when the metal cools.

FIG. 8D shows a configuration for microelectronic assembly 10 where end 36 of wire bond 32 includes a surface 38 that is spaced above major surface 44 of encapsulation layer 42. Such a configuration can present benefits similar to that discussed with respect to cavity 64, above, specifically, by providing a more robust connection with a solder mass 68 that wicks along the portion of edge surface 37 that is uncovered by encapsulation layer 42 above surface 44. In an embodiment, end surface 38 can be spaced above surface 42 at a distance of between about 10 μm and 50 μm. Additionally, in the embodiment of FIG. 8D and any of the other embodiments in which a portion of edge surface 37 is uncovered by encapsulation layer 42 above a surface of encapsulation layer 42, the end can include a protective layer formed thereon. Such a layer can include an oxidation protection layer, including those made from gold, an oxide coating or an OSP.

Figure 9:
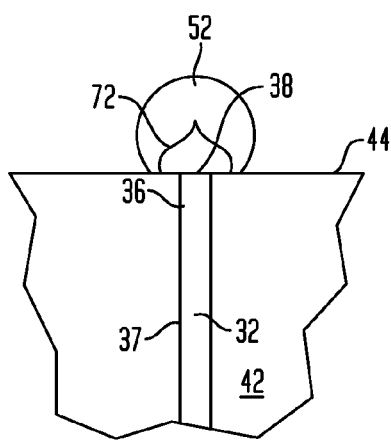
FIG. 9 shows a detail view of a portion of a microelectronic package according to an alternative embodiment of the present invention.

FIG. 9 shows an embodiment of microelectronic assembly 10 with a stud bump 72 formed on end surface 38 of wire bond 32. Stud bump 72 can be formed after making microelectronic assembly 10 by applying another, modified wire bond on top of end surface 44 and optionally extending along a portion of surface 44. The modified wire bond is cut or otherwise severed near the base thereof without drawing out a length of wire. Stud bumps 72 containing certain metals may be applied directly to ends 38 without first applying a bonding layer such as a UBM, thus providing way of forming conductive interconnects to bond pads which are not directly wettable by solder. This can be useful when wire bond 32 is made from a non-wettable metal. In general, stud bumps consisting essentially of one or more of copper, nickel, silver, platinum and gold can be applied this way. FIG. 9 shows a solder mass 68 formed over stud bump 72 for electronic or mechanical connection to an additional microelectronic assembly.

Figure 10A:
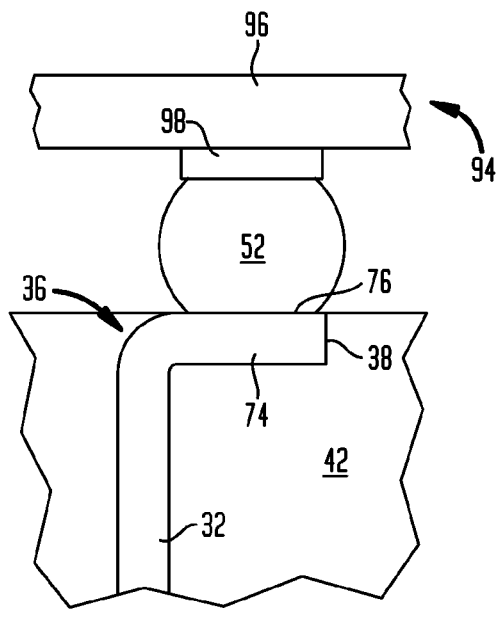
FIGS. 10A-10D show a detail view of a portion of a microelectronic package according to various embodiments of the present invention.
Figure 10B:
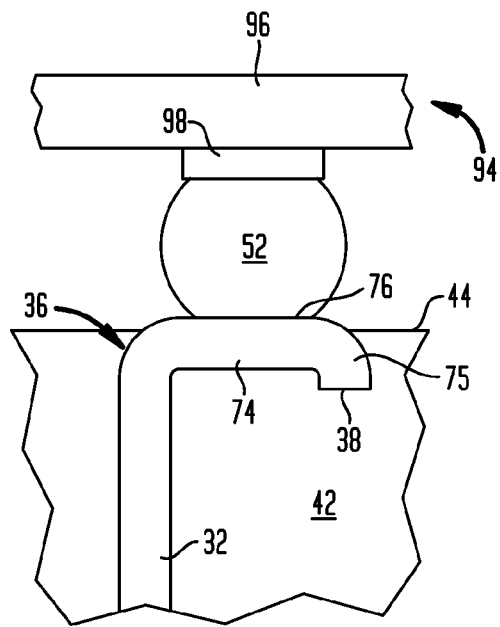
Figure 10C:
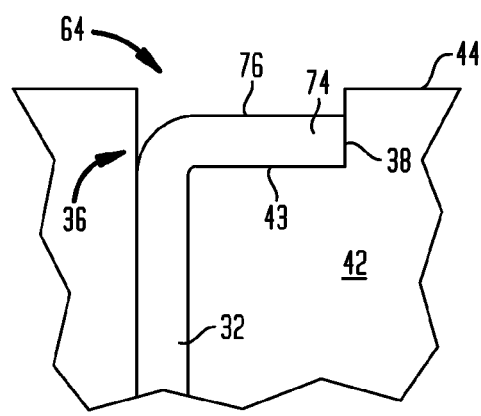
Figure 10D:
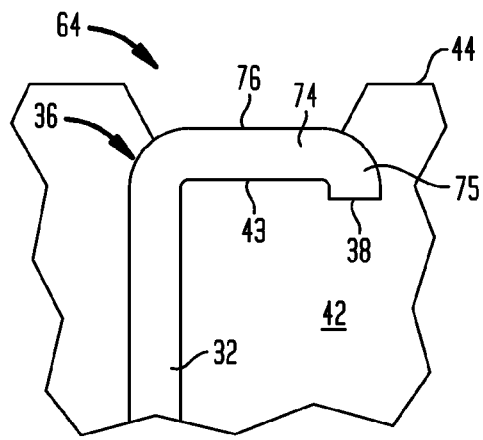

FIGS. 10A-10D show configurations for ends 36 of wire bonds 32 that include a bent or curved shape. In each embodiment, end 36 of wire bond 32 is bent such that a portion 74 thereof extends substantially parallel to surface 44 of encapsulation layer 42 such that at least a portion of edge surface 76 is not covered by, for example, major surface 44. This portion of edge surface 37 can extend upwards outside of surface 44 or can be ground or otherwise flattened so as to extend substantially flush with surface 44. The embodiment of FIG. 10A includes an abrupt bend in wire bond 32 at the portion 74 of end 36 that is parallel to surface 44 and terminates in an end surface 38 that is substantially perpendicular to surface 44. FIG. 10B shows an end 36 having a more gradual curve near the portion 74 of end 36 that is parallel to surface 44 than that which is shown in FIG. 10A. Other configurations are possible, including those in which a portion of a wire bond according to those shown in FIG. 3, 4, or 5 includes an end with a portion thereof substantially parallel to surface 44 and having a portion of the edge surface thereof uncovered by encapsulation layer 42 at a location within surface 44. Additionally, the embodiment of FIG. 10B includes a hooked portion 75 on the end thereof, which positions end surface 38 below surface 44 within encapsulation layer 42. This can provide a more robust structure for end 36 that is less likely to become dislodged from within encapsulation layer 42. FIGS. 10C and 10D show structures that are, respectively, similar to those shown in FIGS. 10A and 10B, but are uncovered by encapsulation layer 42 at a location along surface 44 by cavities 64 formed in encapsulation layer 42. These cavities can be similar in structure to those discussed above with respect to FIGS. 8A and 8B. The inclusion of ends 36 including a portion 74 thereof that extends parallel to surface 44 can provide increased surface area for connection therewith by virtue of the elongated uncovered edge surface 75. The length of such a portion 74 can be greater than the width of cross-section of the wire used to form wire bond 32.

Figure 29:
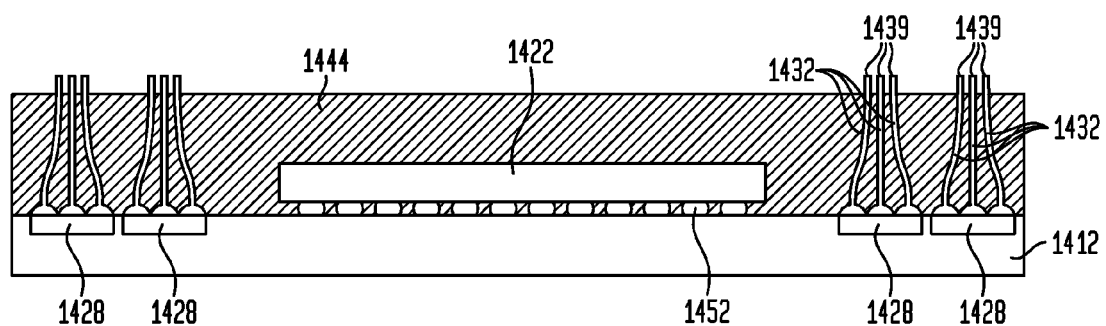
FIG. 29 is a sectional view of a microelectronic package according to a further embodiment.

In a further example shown in FIG. 29, multiple wire bonds 1432 can be joined on a single conductive element 1428. Such a group of wire bonds 1432 can be used to make additional connection points over the encapsulation layer 1442 for electrical connection with conductive element 1428. The exposed portions 1439 of the commonly-joined wire bonds 1432 can be grouped together on surface 1444 of encapsulation layer 1442 in an area, for example about the size of conductive element 1428 itself or another area approximating the intended size of a bonding mass for making an external connection with the wire bond 1432 group. Such wire bonds 1432 can be either ball-bonded, as shown, or edge bonded on conductive element 1428, as described above. The various techniques described herein for severing the metal wire during the wire bonding process, e.g., by laser or other cutting instrument can be employed when forming multiple wire bonds to a conductive element on a substrate.

Figure 11:
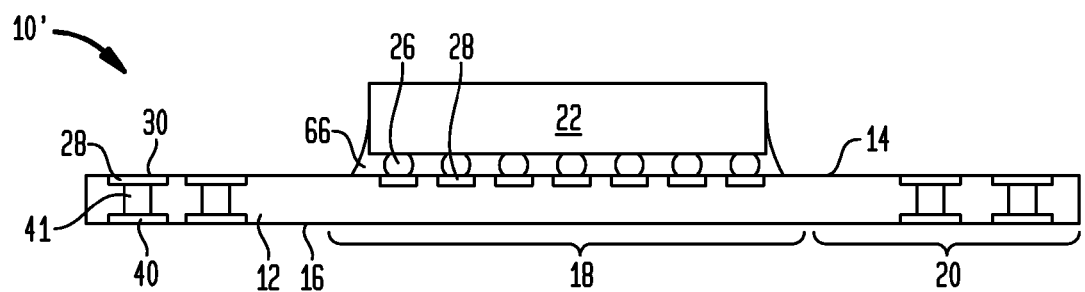
FIGS. 11-14 show a microelectronic package during various steps of fabrication thereof according to an embodiment of the present invention.

FIGS. 11-15 show a microelectronic assembly 10 in various steps of a fabrication method thereof. FIG. 11 shows microelectronic assembly 10' at a step where microelectronic element 22 has been electrically and mechanically connected to substrate 12 on first surface 14 and within first region 18, thereof. Microelectronic element 22 is shown in FIG. 11 as being mounted on substrate 12 in a flip-chip arrangement, such as through contacts on microelectronic element 22 which face and are joined to corresponding contacts on a confronting surface 14 of the substrate. For example, the joints between the contacts of the microelectronic element and the substrate can be made through electrically conductive material such as masses 26, e.g., a conductive paste, conductive matrix material, solder masses, and the contacts can be of any suitable configuration such as pads, posts, e.g., micropillars, stud bumps, etc., among others. "Flip-chip bonding", is used herein to mean such arrangement of face-to-face electrical bonding between corresponding contacts of a microelectronic element and a substrate, or between a microelectronic element and another microelectronic element.

Alternatively face-up wire bonding of the microelectronic element's contacts to the substrate could be used instead, such as seen in the example of FIG. 1. In the embodiment of the method step shown in FIG. 11, a dielectric underfill layer 66 may be provided between microelectronic element 22 and substrate 12.

Figure 12:
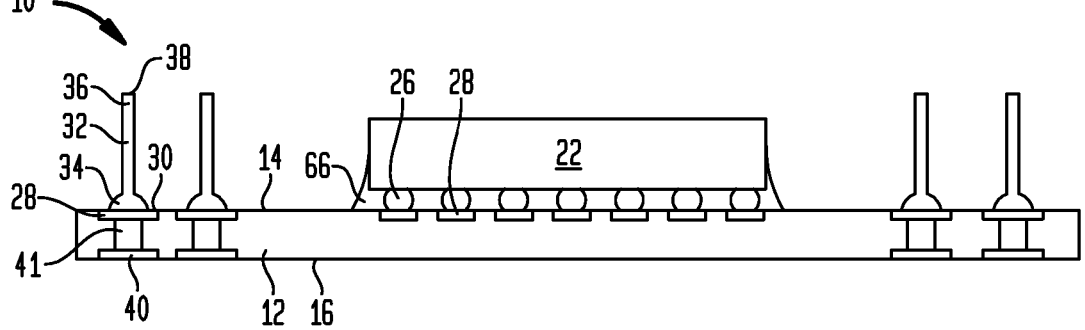

FIG. 12 shows microelectronic assembly 10" having wire bonds 32 applied on pads 30 of conductive elements 28 exposed on first surface 14 of substrate 12. As discussed, wire bonds 32 can be applied by heating an end of a wire segment to soften the end such that it forms a deposition bond to conductive element 28 when pressed thereto, forming base 34. The wire is then drawn out away from conductive element 28 and manipulated, if desired, in a specified shape before being cut or otherwise severed to form end 36 and end surface of wire bond 32. Alternatively, wire bonds 32 can be formed from, for example, an aluminum wire by wedge bonding. Wedge-bonding is formed by heating a portion of the wire adjacent the end thereof and dragging it along the conductive element 28 with pressure applied thereto. Such a process is described further in U.S. Pat. No. 7,391,121, the disclosure of which is hereby incorporated by reference herein in its entirety.

Figure 13:
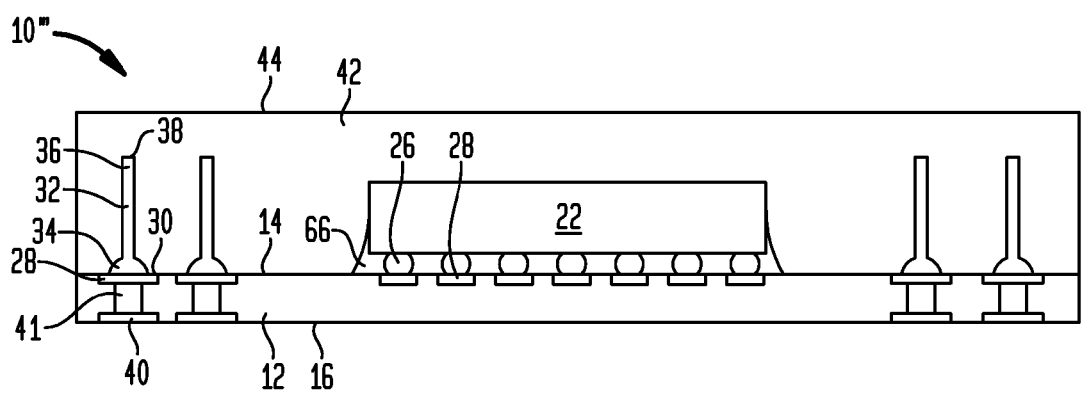

In FIG. 13 encapsulation layer 42 has been added to microelectronic assembly 10'" by being applied over first surface 14 of substrate, extending upwardly therefrom and along edge surfaces 37 of wire bonds 32. Encapsulation layer 42 also covers underfill layer 66. Encapsulation layer 42 can be formed by depositing a resin over microelectronic assembly 10" shown in FIG. 12. This can be done by placing assembly 10" in an appropriately configured mold having a cavity in the desired shape of the encapsulation layer 42 that can receive assembly 10'. Such a mold and the method of forming an encapsulation layer therewith can be as shown and described in U.S. Pat. App. Pub. No 2010/0232129, the disclosure of which is incorporated by reference herein it its entirety. Alternatively, encapsulation layer 42 can be prefabricated to the desired shape from an at least partially compliant material. In this configuration, compliant properties of the dielectric material allow encapsulation layer 42 to be pressed into position over wire bonds 32 and microelectronic element 22. In such a step, wire bonds 32 penetrate into the compliant material forming respective holes therein, along which encapsulation layer 42 contacts edge surfaces 37. Further, microelectronic element 22 may deform the compliant material so that it can be received therein. The compliant dielectric material can be compressed to expose end surfaces 38 on outer surface 44. Alternatively, any excess compliant dielectric material can be removed from encapsulation layer to form a surface 44 on which ends surfaces 38 of wire bonds 32 are uncovered or cavities 64 can be formed that uncover end surfaces 38 at a location within surface 63.

Figure 14:
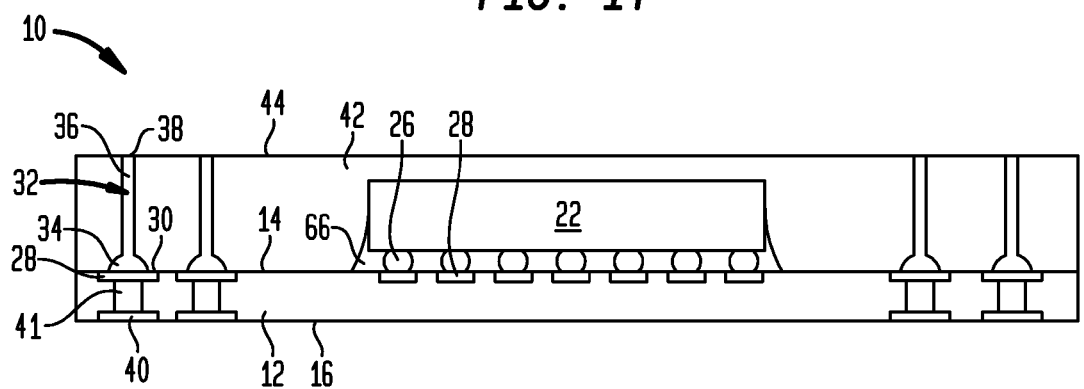

In the embodiment shown in FIG. 13, encapsulation layer is formed such that, initially, surface 44 thereof is spaced above end surfaces 38 of wire bonds 32. To expose the end surfaces 38, the portion of encapsulation layer 42 that is above end surfaces 38 can be removed, exposing a new surface 44' that is substantially flush with end surfaces 42, as shown in FIG. 14. Alternatively, cavities 64, such as those shown in FIGS. 8A and 8B can be formed in which end surfaces 38 are uncovered by encapsulation layer 42. In a further alternative, encapsulation layer 42 can be formed such that surface 44 is already substantially flush with end surfaces 48 or such that surface 44 is positioned below end surfaces 48, as shown in FIG. 8D. Removal, if necessary, of a portion of encapsulation layer 42 can be achieved by grinding, dry etching, laser etching, wet etching, lapping, or the like. If desired, a portion of the ends 36 of wire bonds 32 can also be removed in the same, or an additional, step to achieve substantially planar end surface 38 that are substantially flush with surface 44. If desired, cavities 64 can also be formed after such a step, or stud bumps, as shown in FIG. 10 can also be applied. The resulting microelectronic assembly 10 can then be affixed on a PCB or otherwise incorporated in a further assembly, for example a stacked package, as shown in FIG. 6.

Figure 15:
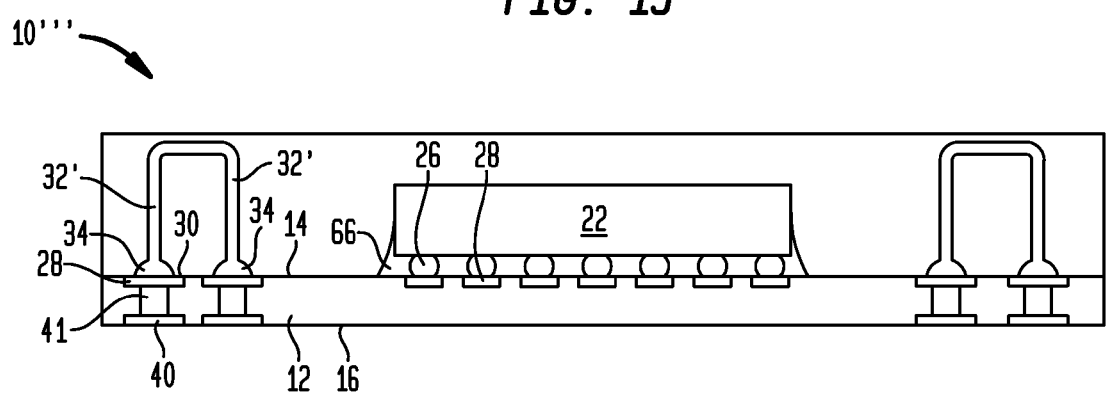
FIG. 15 shows a microelectronic package during a fabrication step according to an alternative embodiment of the present invention.

In an alternative embodiment shown in FIG. 15, wire bonds 32 are initially formed in pairs as portions 32' of a wire loop 86. In this embodiment, loop 86 is made in the form of a wire bond as discussed above. The wire segment is drawn upward, then bent and drawn in a direction having at least a component thereof in the direction of the first surface 14 of substrate 13 and to a position substantially overlying an adjacent conductive element 28. The wire is then drawn substantially downward to a position near the adjacent conductive element 28 before being cut or otherwise severed. The wire is then heated and connected to the adjacent conductive element 28 by deposition bonding or the like to form loop 86. Encapsulation layer 42 is then formed so as to substantially cover loop 86. A portion of encapsulation layer 42 is then removed by grinding, etching or the like by a process that also removes a portion of loop 86 such that the loop is severed and divided into its two portions 32', thereby forming wire bonds 32 with end surfaces 38 uncovered by encapsulation layer 42 at a location along surface 44 which is formed on encapsulation layer 42. Subsequent finishing steps can then be applied to assembly 10, as discussed above.

FIGS. 16A-16C show steps in an alternative embodiment for making cavities 64, as discussed above, surrounding ends 36 of wire bonds 32. FIG. 16A shows a wire bond 32, of the general type discussed above with respect to FIGS. 1-6. Wire bond 32 has a mass of sacrificial material 78 applied on end 36 thereof. The sacrificial material mass 78 can be substantially spherical in shape, which can result from the material's surface tension during formation thereof, or other desired shapes that would be understood by a person of ordinary skill in the art. Sacrificial material mass 78 can be formed by dipping the ends 36 of wire bonds 32 in solder paste to coat the ends thereof. The viscosity of the solder paste can be adjusted prior to dipping to control the amount of solder mass that wicking and surface tension cause to adhere to ends 36. This can, accordingly, affect the size of masses 78 that are applied on ends 36. Alternatively, masses 78 can be formed by depositing a soluble material onto the ends 36 of the wire bonds 32. Other possible masses 78 can be individual solder balls or other masses on ends or by other means using other materials, such as copper or gold flashing, used in microelectronic component fabrication, that can later be removed.

In FIG. 16B, a dielectric layer 42 is shown having been added to assembly 10, including upward along edge surfaces 37 of wire bonds 32. The dielectric layer also extends along a portion of the surface of the sacrificial material mass 78, such that it is spaced apart from the end 36 of the wire bond 32 thereby. Subsequently, sacrificial material mass 78 is removed, such as by washing or rinsing in a solvent, melting, chemical etching or other technique, leaving cavity 64 in dielectric layer 42 substantially in the negative shape of mass 78 before removal thereof, and exposing a portion of edge surface 37 near end 36 of wire bond 32.

Alternatively, sacrificial material mass 78 can be formed to coat substantially all of wire bond 32 by extending along the edge surface 37 thereof. This arrangement is shown in FIG. 17A. Such a coating can be applied over wire bonds 32 after formation on assembly 10, as discussed above, or can be applied as a coating to the wire used to make wire bonds 32. This would, essentially, be in the form or a coated wire or a two-part wire, for example, with an inner core of copper and a solder coating. FIG. 17B shows dielectric layer 42 applied over wire bonds 32 and the sacrificial mass 78 so as to extend along the edge surface 79 of the sacrificial mass 78, thereby spacing apart dielectric layer 42 from wire bond 32 substantially along the length thereof.

FIG. 17C shows the structure that results from removing a portion of the sacrificial material mass 78 to form cavity 64 around end 36 and exposing a portion of edge surface 37. In such an embodiment a majority of, or at least a portion of, the sacrificial material mass 78 can be left in place between dielectric layer 42 and wire bond 32. FIG. 17C further shows a solder mass 52 electrically and mechanically connecting wire bond 32 to a contact pad 40A of another microelectronic structure 10A.

After formation of the wire segment and bonding thereof to a conductive element to form a wire bond, particularly of the ball bond type discussed above, the wire bond (32 in FIG. 1, for example) is then separated from a remaining portion of the wire within the capillary (such as 804 in FIG. 32). This can be done at any location remote from the base 34 of the wire bond 32 and is preferably done at a location remote from the base 34 by a distance at least sufficient to define the desired height of the wire bond 32. Such separation can be carried out by a mechanism disposed within the capillary 804 or disposed outside of the capillary 804, between the face 806 and the base 34 of the wire bond 32. In one method, the wire segment 800 can be separated by effectively burning through the wire 800 at the desired separation point, which can be done by application of a spark or flame thereto. To achieve greater accuracy in wire bond height, different forms of cutting the wire segment 800 can be implemented. As described herein, cutting can be used to describe a partial cut that can weaken the wire at a desired location or cutting completely through the wire for total separation of the wire bond 32 from the remaining wire segment 800.

In one example shown in FIG. 32 a cutting blade 805 can be integrated into the bond head assembly, such as within capillary 804. As shown, an opening 807 can be included in the side wall 820 of the capillary 804 through which cutting blade 805 can extend. The cutting blade 805 can be moveable in and out of the interior of the capillary 804 so that it can alternately allow the wire 800 to freely pass therethrough or engage the wire 800. Accordingly, the wire 800 can be drawn out and the wire bond 32 formed and bonded to a conductive element 28 with the cutting blade 805 in a position outside of the capillary interior. After bond formation, the wire segment 800 can be clamped using a clamp 803 integrated in the bond head assembly to secure the position of the wire. The cutting blade 803 can then be moved into the wire segment to either fully cut the wire or to partially cut or weaken the wire. A full cut can form end surface 38 of the wire bond 32 at which point the capillary 804 can be moved away from the wire bond 32 to, for example, form another wire bond. Similarly, if the wire segment 800 is weakened by the cutting blade 805, movement of the bond head unit with the wire still held by the wire clamp 803 can cause separation by breaking the wire 800 at the area weakened by the partial cut.

The movement of the cutting blade 805 can be actuated by pneumatics or by a servo motor using an offset cam. In other examples the cutting blade 805 movement can be actuated by a spring or a diaphragm. The triggering signal for the cutting blade 805 actuation can be based on a time delay that counts down from formation of the ball bond or can be actuated by movement of the capillary 804 to a predetermined height above the wire bond base 34. Such a signal can be linked to other software that operates the bonding machine so that the cutting blade 805 position can be reset prior to any subsequent bond formation. The cutting mechanism can also include a second blade (not shown) spaced opposite blade 805 to cut the wire from opposing sides thereof.

Figure 33:
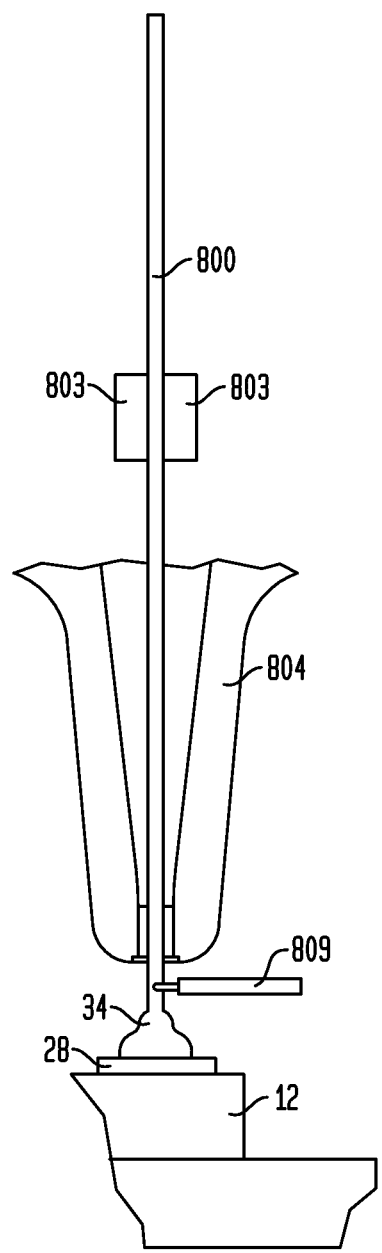
FIG. 33 shows a portion of a machine that can be used in forming various wire bond vias according in a method according to another embodiment of the present disclosure.

In another example, a laser 809 can be assembled with the bond head unit and positioned to cut the wire segment. As shown in FIG. 33, a laser head 809 can be positioned outside of capillary 804 such as by mounting thereto or to another point on the bond head unit that includes capillary 804. The laser can be actuated at a desired time, such as those discussed above with respect to the cutting blade 805 in FIG. 32, to cut the wire 800, forming end surface 38 of the wire bond 32 at a desired height above the base 34. In other implementations, the laser 809 can be positioned to direct the cutting beam through or into the capillary 804 itself and can be internal to the bond head unit. In an example, a carbon dioxide laser can be used or, as an alternative, a Nd:YAG or a Cu vapor laser could be used.

Figure 34A:
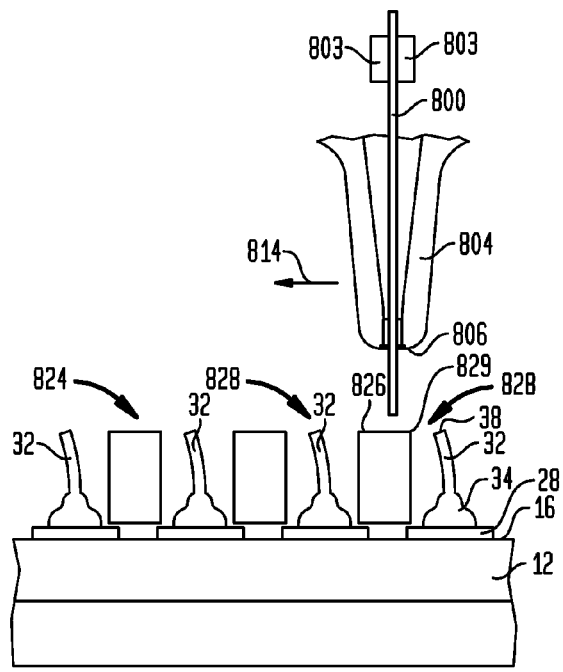
FIGS. 34A-C show various forms of an instrument that can be used in a method for making wire bonds according to an embodiment of the present disclosure.
Figure 34B:
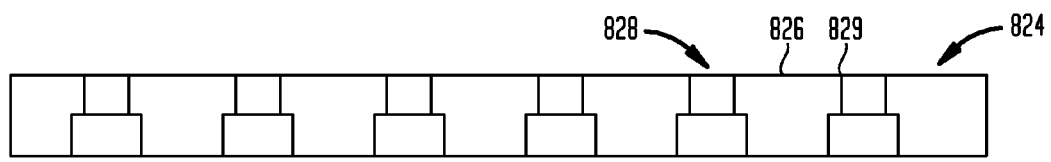
Figure 34C:
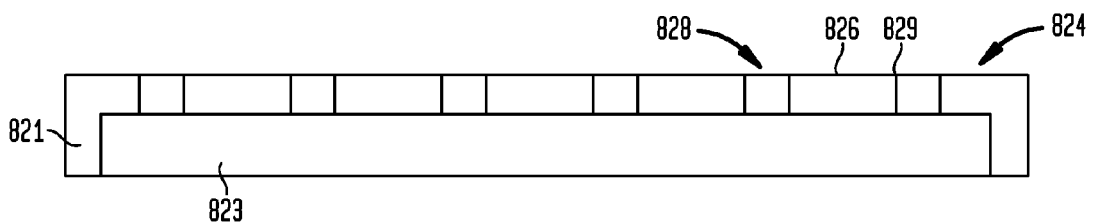

In another embodiment a stencil 824 as shown in FIGS. 34A-C can be used to separate the wire bonds 32 from the remaining wire segment 800. As shown in FIG. 34A, the stencil 824 can be a structure having a body that defines an upper surface 826 at or near the desired height of the wire bonds 32. The stencil 824 can be configured to contact the conductive elements 28 or any portions of the substrate 12 between the conductive elements 28. The stencil includes a plurality of holes 828 that can correspond to the desired locations for the wire bonds 32, such as over conductive elements 28. The holes 828 can be sized to accept the capillary 804 of the bond head unit therein so that the capillary can extend into the hole to a position relative to the conductive element 28 to bond the wire 800 to the conductive element, 28 to form the base 34, such as by ball bonding or the like. The capillary 804 can then be moved vertically out of the hole 828 while drawing out the wire segment to a desired length. Once cleared from the hole 828, the wire segment can be clamped within the bond head unit, such as by clamp 803, and the capillary 804 can be moved in a lateral direction (such as parallel to the surface 826 of stencil 824) to move the wire segment 800 into contact with an edge 829 of the stencil 824 defined by the intersection of the surface of the hole 828 and the outside surface 826 of the stencil 824. Such movement can cause separation of the wire bond 32 from a remaining portion of the wire segment 800 that is still held within the capillary 804. This process can be repeated to form the desired number of wire bonds 32 in the desired locations. In an implementation, the capillary can be moved vertically prior to wire separation such that the remaining wire segment projects beyond the face 806 of the capillary 804 by a distance 802 sufficient to form a subsequent ball bond. FIG. 34B shows a variation of stencil 824 in which the holes 828 are tapered such that they have a diameter that increases from a first diameter at surface 826 to a greater diameter away from surface 826. In another variation, as shown in FIG. 34C, the stencil can be formed having an outer frame 821 having a thickness sufficient to space apart surface 826 at the desired distance from substrate 12. Frame 821 can at least partially surround a cavity 823 configured to be positioned adjacent substrate 12 with a thickness of the stencil 824 extending between the surface 826 and the open area 823 such that the portion of stencil 824 that includes the holes 828 is spaced apart from the substrate 12 when positioned thereon.

Figure 20:
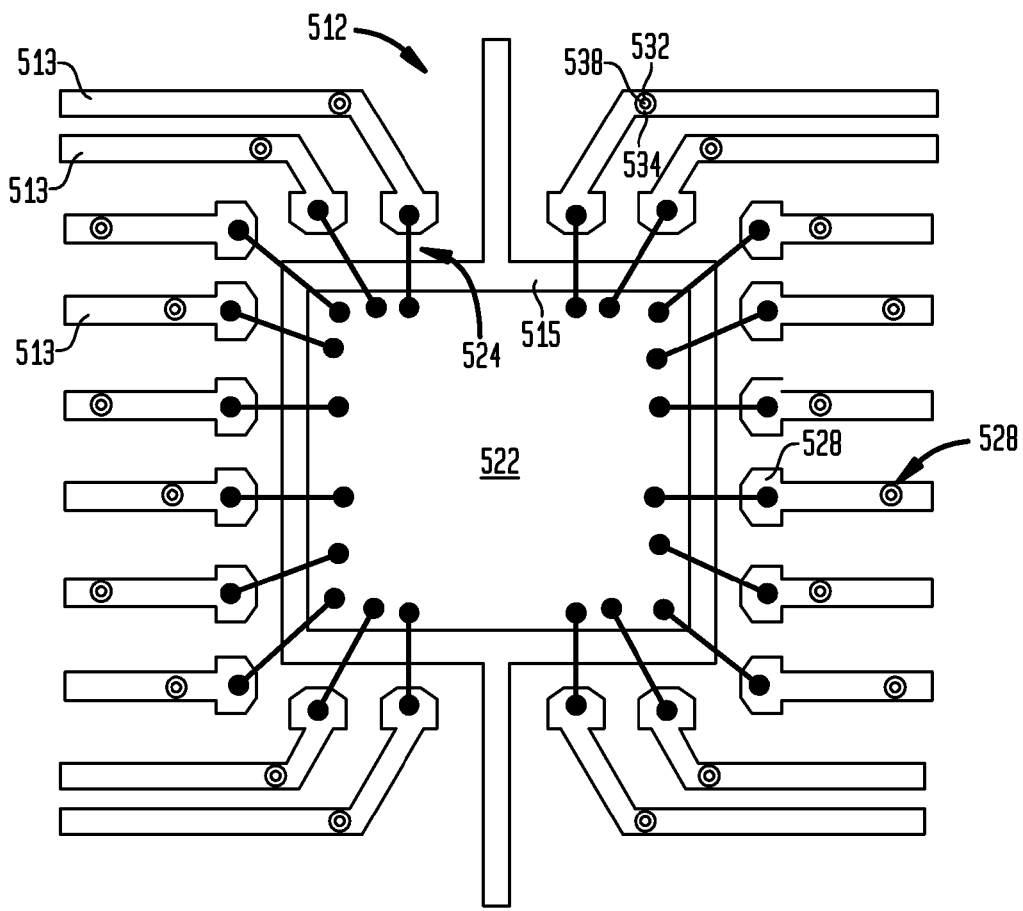
FIG. 20 shows a top view of a microelectronic package according to a further alternative embodiment of the present invention.
Figure 21:
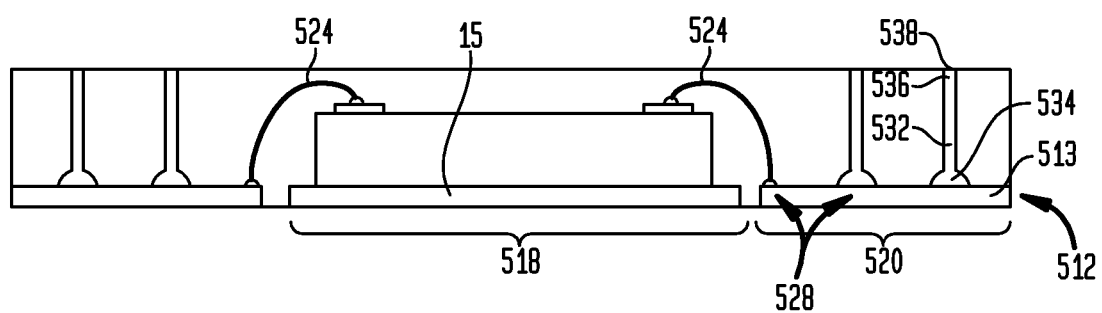
FIG. 21 shows a front elevation view of the microelectronic package of FIG. 20.

FIGS. 20 and 21 show a further embodiment of a microelectronic assembly 510 in which wire bonds 532 are formed on a lead-frame structure. Examples of lead frame structures are shown and described in U.S. Pat. Nos. 7,176,506 and 6,765,287 the disclosures of which are hereby incorporated by reference herein. In general, a lead frame is a structure formed from a sheet of conductive metal, such as copper, that is patterned into segments including a plurality of leads and can further include a paddle, and a frame. The frame is used to secure the leads and the paddle, if used, during fabrication of the assembly. In an embodiment, a microelectronic element, such as a die or chip, can be joined face-up to the paddle and electrically connected to the leads using wire bonds. Alternatively, the microelectronic element can be mounted directly onto the leads, which can extend under the microelectronic element. In such an embodiment, contacts on the microelectronic element can be electrically connected to respective leads by solder balls or the like. The leads can then be used to form electrical connections to various other conductive structures for carrying an electronic signal potential to and from the microelectronic element. When the assembly of the structure is complete, which can include forming an encapsulation layer thereover, temporary elements of the frame can be removed from the leads and paddle of the lead frame, so as to form individual leads. For purposes of this disclosure, the individual leads 513 and the paddle 515 are considered to be segmented portions of what, collectively, forms a substrate 512 that includes conductive elements 528 in portions that are integrally formed therewith. Further, in this embodiment, paddle 515 is considered to be within first region 518 of substrate 512, and leads 513 are considered to be within second region 520. Wire bonds 524, which are also shown in the elevation view of FIG. 21, connect microelectronic element 22, which is carried on paddle 515, to conductive elements 528 of leads 515. Wire bonds 532 can be further joined at bases 534 thereof to additional conductive elements 528 on leads 515. Encapsulation layer 542 is formed onto assembly 510 leaving ends 538 of wire bonds 532 uncovered at locations within surface 544. Wire bonds 532 can have additional or alternative portions thereof uncovered by encapsulation layer 542 in structures that correspond to those described with respect to the other embodiments herein.

Figure 24:
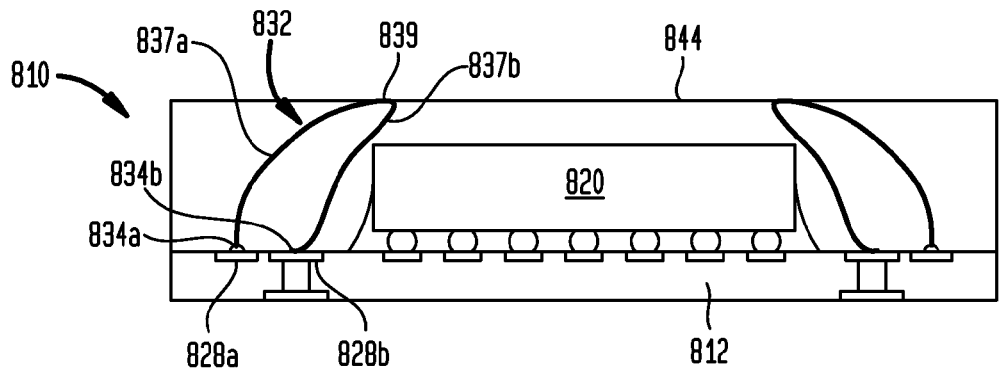
FIG. 24 shows a front elevation view of a microelectronic package according to a further alternative embodiment of the present invention.
Figure 25:
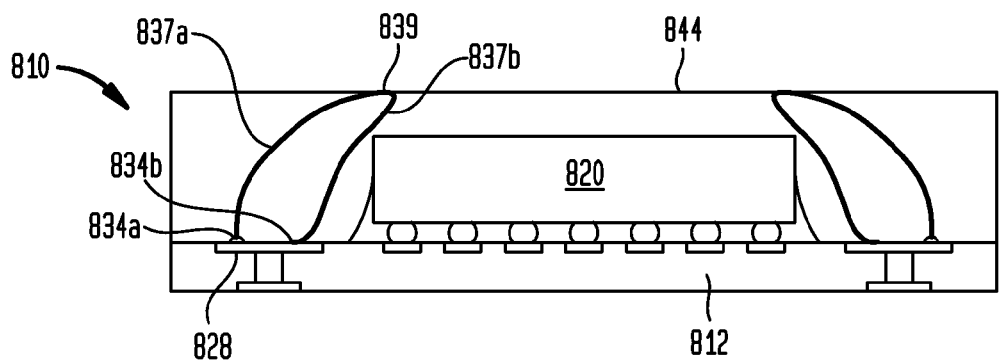
FIG. 25 shows a front elevation view of a microelectronic package according to a further alternative embodiment of the present invention.
Figure 26:
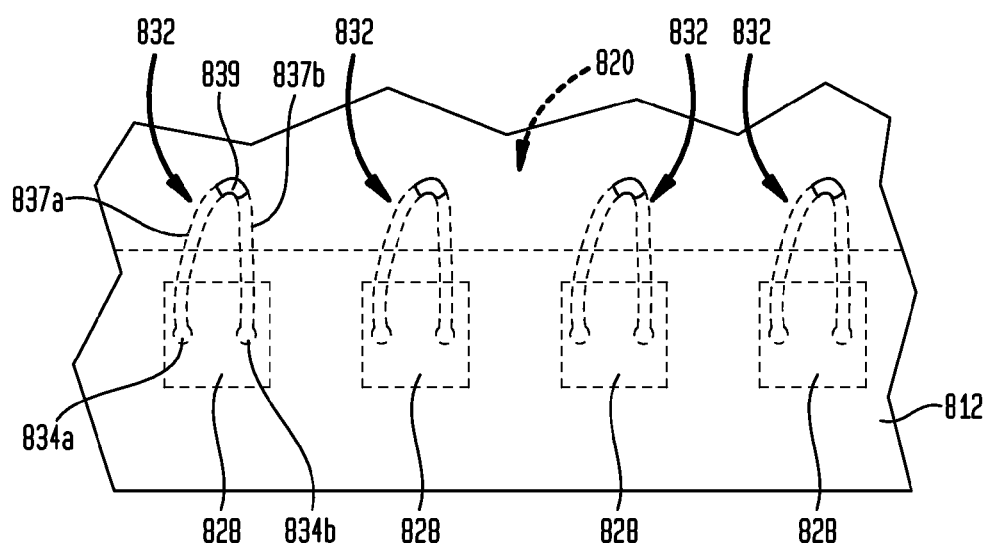
FIG. 26 shows a top view of a microelectronic package according to a variation of the embodiment of FIG. 25.

FIGS. 24-26 show a further alternative embodiment of a microelectronic package 810 having closed-loop wire bonds 832. The wire bonds 832 of this embodiment include two bases 834a and 834b that can be joined to adjacent conductive elements 828a and 828b, as shown in FIG. 24. Alternatively, the bases 834a,834b can both be joined on a common conductive element 828, as shown in FIGS. 25 and 26. In such an embodiment, wire bonds 832 define an edge surface 837 that extends between the two bases 834a,834b in a loop such that the edge surface 837 extends upward in respective portions 837a and 837b from the bases to an apex 839 at a surface 844 of the encapsulation layer 842 above the substrate 812. Encapsulation layer 842 extends along at least some of edge surface portions 837a, 837b, separating the respective portions from one another, as well as from other wire bonds 832 in package 810. At apex 839, at least a portion of the edge surface 837 is uncovered by the encapsulation layer 842, such that the wire bond 832 is available for electrical interconnection with another component, which can be another microelectronic component or other component, e.g., a discrete element such as a capacitor or inductor. As shown in FIGS. 24-26, wire bonds 832 are formed such that apex 839 is offset from conductive element 828 in at least one lateral direction across the surface of the substrate 812. In one example, apex 839 can overlie a major surface of microelectronic element 820 or otherwise overlie a first region of the substrate 812 with which the microelectronic element 820 is aligned. Other configurations for wire bonds 832 are possible, including configurations in which apex 839 is positioned in any of the locations of the end surfaces of the wire bonds discussed in the other embodiments. Further, apex 839 can be uncovered within a hole, such as shown in FIG. 8A. Still further, apex 839 can be elongated and can be uncovered on surface 844 extending over a length thereof, as shown with respect to the edge surfaces in FIGS. 10A-10D. By providing a connection feature in the form of the uncovered edge surface 837 surrounding apex 839 that is supported a wire bond 832 extending between two bases 834a,834b, rather than one, more accurate placement of the connection feature in the directions defined by major surface 844 can be achieved.

Figure 27:
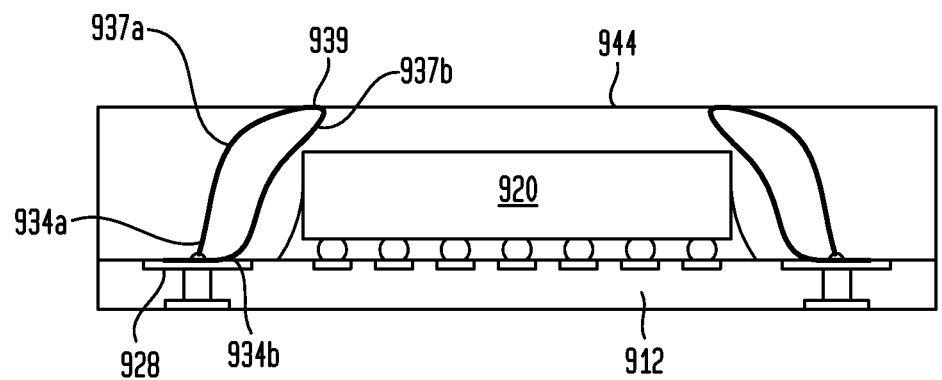
FIG. 27 shows a front elevation view of a microelectronic package according to a further alternative embodiment of the present invention.
Figure 28:
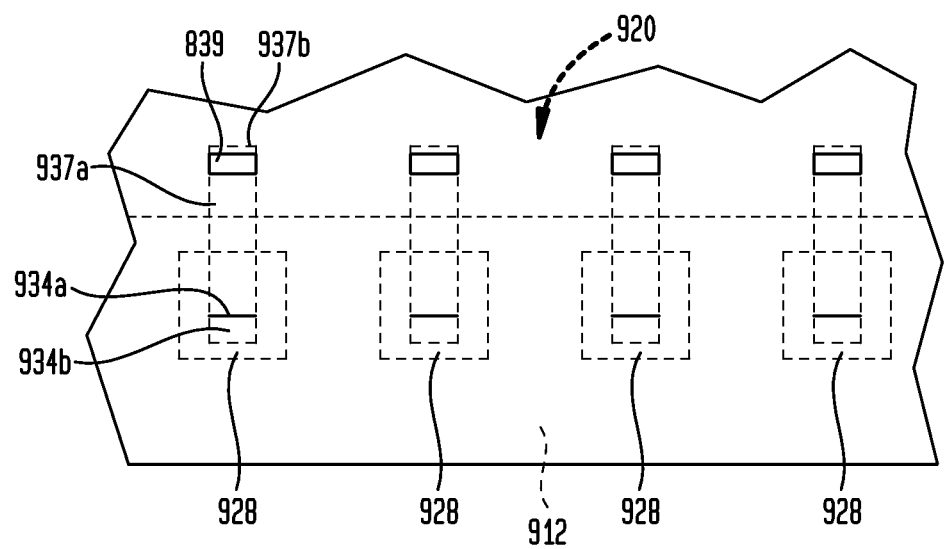
FIG. 28 shows a top view of a microelectronic package according to a variation of the embodiment of FIG. 27.

FIGS. 27 and 28 show a variation of the embodiment of in FIGS. 24-26, in which bond ribbons 934 are used in place of wire bonds 834. Bond ribbons can be a generally flat piece of conductive material, such as any of the materials discussed previously for the formation of wire bonds. A bond ribbon structure can be wider than it is thick, in contrast to a wire bond, which can be generally circular in cross section. As shown in FIG. 27, bond ribbons 934 each include a first base 934a that can be bonded extending along a portion of conductive element 928. A second base 934b of ribbon bond 932 can be joined to a portion of first base 934a. Edge surface 937 extends between bases 934a and 934b in two corresponding portions 937a and 937b to apex 939. A portion of edge surface in the area of apex 939 is uncovered by encapsulant 942 along a portion of major surface 944, thereof. Further variations are possible, such as those described with respect to the wire bonds used in the other embodiments disclosed herein.

Figure 23:
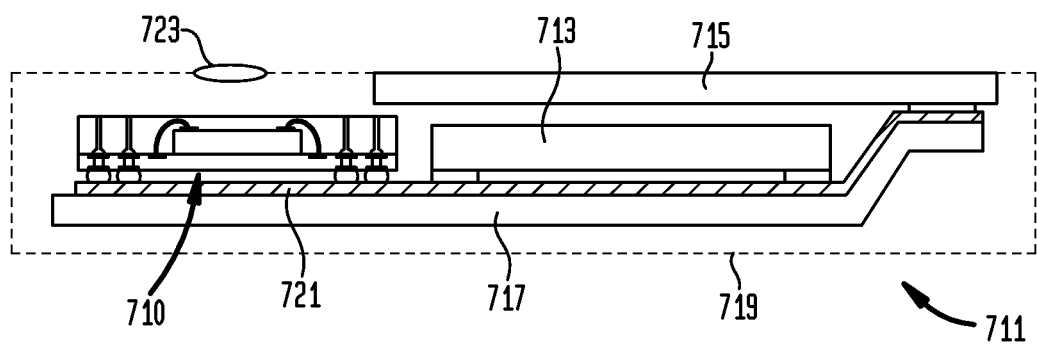
FIG. 23 shows a system according to a further embodiment of the present invention.

The structures discussed above can be utilized in construction of diverse electronic systems. For example, a system 711 in accordance with a further embodiment of the invention includes microelectronic assembly 710, as described above, in conjunction with other electronic components 713 and 715. In the example depicted, component 713 is a semiconductor chip whereas component 715 is a display screen, but any other components can be used. Of course, although only two additional components are depicted in FIG. 23 for clarity of illustration, the system may include any number of such components. The microelectronic assembly 710 as described above may be, for example, a microelectronic assembly as discussed above in connection with FIG. 1, or a structure incorporating plural microelectronic assemblies as discussed with reference to FIG. 6. Assembly 710 can further include any one of the embodiments described in FIGS. 2-22. In a further variant, multiple variations may be provided, and any number of such structures may be used.

Microelectronic assembly 710 and components 713 and 715 are mounted in a common housing 719, schematically depicted in broken lines, and are electrically interconnected with one another as necessary to form the desired circuit. In the exemplary system shown, the system includes a circuit panel 717 such as a flexible printed circuit board, and the circuit panel includes numerous conductors 721, of which only one is depicted in FIG. 23, interconnecting the components with one another. However, this is merely exemplary; any suitable structure for making electrical connections can be used.

The housing 719 is depicted as a portable housing of the type usable, for example, in a cellular telephone or personal digital assistant, and screen 715 is exposed at the surface of the housing. Where microelectronic assembly 710 includes a light-sensitive element such as an imaging chip, a lens 723 or other optical device also may be provided for routing light to the structure. Again, the simplified system shown in FIG. 23 is merely exemplary; other systems, including systems commonly regarded as fixed structures, such as desktop computers, routers and the like can be made using the structures discussed above.

The above-described embodiments and variations of the invention can be combined in ways other than as specifically described above. It is intended to cover all such variations which lie within the scope and spirit of the invention.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of making a microelectronic assembly, comprising:
   a) bonding a metal wire to a conductive element exposed at a first surface of a substrate, thereby forming a base of a wire bond on the conductive element;
   b) extending a length of the metal wire through a capillary of a bonding tool;
   c) cutting the metal wire within the capillary at a location between a clamped portion of the metal wire within the bonding tool and the base to at least partially define an end surface of the wire bond at a predetermined distance from the base of the wire bond;
   d) forming an end portion at the end surface having a cross-section wider than a cross-section of the wire bond; and
   e) forming a dielectric encapsulation layer overlying the first surface of the substrate and defining a major surface spaced apart from the first surface, wherein the encapsulation layer is formed so as to at least partially cover the first surface of the substrate and a portion of the wire bond, such that an unencapsulated portion of the wire bond is defined by a portion of the end portion,
   wherein the wire bond has a first edge surface defined between the base and the end portion, the end portion has a second edge surface that extends outward from the first edge surface of the wire bond below the major surface of the dielectric encapsulation layer, and the dielectric encapsulation layer surrounds the second edge surface.

2. The method of claim 1, wherein the end portion has a substantially rounded configuration.

3. The method of claim 1, wherein the end portion has a ball shape.

4. The method of claim 1, wherein the cutting is performed before the forming of the end portion.

* * * * *